(12) United States Patent
Takahashi et al.

(10) Patent No.: US 6,282,350 B1
(45) Date of Patent: Aug. 28, 2001

(54) PHOTOELECTRONIC DEVICE AND METHOD OF MANUFACTURING THE SAME

(75) Inventors: Shoichi Takahashi, Saku; Hiroshi Naka, Komoro; Toshimasa Miura, Fujisawa; Shuji Eguchi, Toukai-mura, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/379,468

(22) Filed: Aug. 24, 1999

(30) Foreign Application Priority Data

Aug. 25, 1998 (JP) .................................................. 10-239112
Sep. 24, 1998 (JP) .................................................. 10-270339

(51) Int. Cl.⁷ .................................................... G02B 6/36
(52) U.S. Cl. ................................ 385/88; 385/91; 385/93; 385/94; 385/33
(58) Field of Search ................................ 385/88–94, 49, 385/129, 145, 33; 430/158, 298, 203; 372/50; 526/171, 281; 528/353

(56) References Cited

U.S. PATENT DOCUMENTS 5,727,105 * 3/1998 Nagata et al. .......................... 385/94

* cited by examiner

*Primary Examiner*—Phan T. H. Palmer
(74) *Attorney, Agent, or Firm*—Mattingly, Stanger & Malur, P.C.

(57) ABSTRACT

There is provided a method for manufacturing a photoelectronic device comprising a silicon platform (support substrate) having a groove for guiding an optical fiber, a semiconductor laser chip secured on the substrate and an optical fiber fitted in the groove at one end thereof to be secured on the support substrate wherein the optical fiber fitted in the groove is secured on the support substrate with a first bonding element constituted by an adhesive injected to fill the groove under the optical fiber; one surface of the support substrate is covered with silicone gel; the support substrate is secured in a package made of plastic; and the package is filled with the silicone gel which is a protective film transparent to light transmitted by the optical fiber and resistant to humidity.

32 Claims, 19 Drawing Sheets

PHOTOELECTRONIC DEVICE AND METHOD OF MANUFACTURING THE SAME

The present invention relates to a photoelectronic device (semiconductor optical module) and a method of manufacturing the same and, more particularly, to a technique effective for bonding and securing an optical fiber to a silicon substrate having a groove on the surface thereof referred to as "silicon platform" using a bonding element such as thermosetting resin or an ultraviolet-setting adhesive.

BACKGROUND OF THE INVENTION

Photoelectronic device incorporating a semiconductor laser (semiconductor laser chip) are used as light sources for information processing apparatuses and light sources for optical communication.

One well-known type of photoelectronic devices is photoelectronic devices (semiconductor laser devices) having a box-type package structure.

Referring to passive alignment mounting utilizing a silicon platform, for example, passive alignment type optical modules are known which has a structure in which a silicon platform is mounted in a package having leads and a cover; a laser diode, a monitor photodiode and a pig-tail optical fiber are mounted on the silicon platform; and a presser plate is mounted.

SUMMARY OF THE INVENTION

The inventors are working on techniques for securing an optical fiber on a silicon platform in a short period of time and techniques to reduce the cost of packaging in optoelectonic apparatuses incorporating a semiconductor laser (passive alignment type optical module).

The inventors made the following studies of techniques for securing an optical fiber on a silicon platform in a short period of time.

In a conventional semiconductor optical module utilizing a silicon platform (support substrate), an optical fiber embedded in the silicon platform is secured after adjusting optical coupling between the end of the optical fiber embedded in a groove on the silicon platform so as to trail along it and a semiconductor laser chip secured on the surface of the silicon platform. It is secured using (1) a technique for securing it with thermosetting resin (thermosetting epoxy resin) or an adhesive such as an ultraviolet-setting adhesive and (2) a technique for securing the optical fiber while pressing it against the silicon platform with a presser plate.

When an optical fiber is secured with thermosetting resin, a process of applying and setting the thermosetting resin must be performed with the optical fiber pressed against the silicon platform to remain static after adjustment of optical coupling.

However, this method reduces the efficiency of an operation of securing optical fiber because the thermosetting resin takes a long time to be set. For example, in the case of epoxy resin used as thermosetting resin, the setting process takes about two minutes even at a temperature of 150° C. which is in the excess of the guaranteed temperature for an optical fiber.

Since the adjustment of optical coupling is performed using a fiber inserting apparatus, the long time spent for the adjustment of optical coupling results in a reduction in the operating efficiency of the fiber inserting apparatus. In addition, a fiber inserting apparatus is expensive and consequently increases the cost for the adjustment of optical coupling.

The method of setting thermosetting resin on a fiber inserting apparatus after the adjustment of optical coupling has had a problem in that the process of setting thermosetting resin can not be performed on a batch process basis and this reduces the operating efficiency of a fiber inserting apparatus further.

The efficiency of the conventional operation of securing an optical fiber with thermosetting resin is thus reduced, which hinders any reduction in the manufacturing cost of a photoelectronic device (optical module).

The conventional technique for securing an optical fiber with thermosetting resin results in a reduction of the yield of optical axis alignment because the state of optical coupling can change if the optical fiber is moved before the thermosetting resin is reliably set.

Referring to the technique of securing an optical fiber on a silicon platform by applying an ultraviolet-setting adhesive to a part of the optical fiber and silicon platform and thereafter irradiating the ultraviolet-setting adhesive with ultraviolet light to set the ultraviolet-setting adhesive, it secures an optical fiber with reduced reliability because regions which can not be irradiated with ultraviolet light are not set, although the setting process utilizing ultraviolet irradiation allows an optical fiber to be secured in a short period of time.

A possible solution is a two-step processing mode which involves setting by means of irradiation with ultraviolet beams and heat setting using an ultraviolet-setting adhesive which can be set by both ultraviolet beams and heat. In this case, the efficiency of an operation of securing an optical fiber (turnaround time: TAT) is reduced because the setting process using heat takes time. An example of this type of ultraviolet-setting adhesives takes a heating time as long as 60 minutes at 120° C.

A heat setting process at a processing temperature as high as 120°C. and with a long processing time as described above can result in deterioration of resin covering an optical fiber (the region of a fiber cable).

In a structure in which a metalized layer is provided on the surface of an optical fiber comprising a core and a clad (optical fiber core) and in which the metalized layer is used to secure the optical fiber to a silicon platform or a cylindrical fiber guide for guiding the optical fiber with solder, when an optical fiber is fitted in a groove on a silicon platform so as to trail along it, variation of the thickness of the metalized layer can make it difficult to adjust optical coupling between the core of the optical fiber and a semiconductor laser chip.

Under such circumstances, the inventors are studying a technique as described below for securing an optical fiber on a silicon platform, although it is not a known technique. Specifically, in a conventional method in which a silicon platform (support substrate) having a groove on the surface thereof is prepared; a photoelectric conversion element (semiconductor laser chip) is thereafter secured on the surface of the support substrate at one end of the groove; an optical fiber is fitted in the groove so as to trail along it; and, thereafter, the state of transmission and reception of light between the photoelectric conversion element and the optical fiber is adjusted and the optical fiber is secured on the support substrate with thermosetting resin, according to the technique, the optical fiber is preliminaryly secured using securing means in a securing time shorter than the setting time of the thermosetting resin while it is pressed against the support substrate, and is thereafter finally secured with thermosetting resin with the pressing cancelled.

For example, an ultraviolet-setting adhesive is applied to a part of the optical fiber and support substrate; the ultraviolet-setting adhesive is set by irradiating it with ultraviolet light to preliminary secure the optical fiber on the support substrate; and a part of the optical fiber which is farther from the semiconductor laser chip than the preliminary secured position is covered with thermosetting resin.

According to this technique, since preliminary securing is carried out using an ultraviolet-setting adhesive, a support substrate and the like can be moved even after the application of thermosetting resin and before the thermosetting resin is set. This allows the support structure and the like to be removed from a fiber inserting apparatus in a short period of time, and the process of setting the thermosetting resin (final securing) can therefore be carried out on a batch process basis. Such a batch process makes it possible to reduce the time required for securing an optical fiber on one support substrate. The reliability of optical coupling is also improved.

In addition to the employment of this technique, the inventors also studied techniques for reducing the cost of a package. In order to achieve a reduction in the package cost, they decided to make a package main body (case) and a cover element (cap) forming a package from plastic and to adopt a structure in which the case and cap are bonded with resin. Further, since plastic is less resistant to humidity than ceramics, it was conceived to improve humidity resistance by sealing the case with silicone gel to cover the surface of components on the support structure including a semiconductor laser chip.

Referring to this technique, however, it was revealed by the inventors that such a silicone gel sealing structure reduces the strength and reliability of the securing of an optical fiber and also reduces humidity resistance. It was found that this is attributable to bubbles generated in silicone gel.

Experiments and studies made on the mechanism of the generation of bubbles revealed that the number of bubbles can increase from the initial value depending on the temperature cycle, i.e., the temperature of the environment of use.

FIG. 25 is a schematic view of a region in which an optical fiber 3 is secured in a groove 2 on a silicon platform (support substrate) 1 through preliminary securing with an ultraviolet-setting adhesive 4 and final securing with thermosetting resin 5 and in which the upper surface of the silicon platform 1 is covered by silicone gel 6. The optical fiber 3 is formed by a clad 3b and a core 3a located in the center of the same. The two-dot chain line represents a semiconductor laser chip 6. As shown in FIG. 25, the generation of a bubble 10 is likely to occur in the silicone gel in an enclosed region 9 defined by the surface of the groove 2 of the silicon platform 1 and the optical fiber.

The presence of the bubble reduces the strength and reliability of the securing of the optical fiber 3 to the silicon platform 1.

Humidity resistance is reduced not only by the presence of the bubble 10 itself but also by the fact that the region of the bubble acts as a nucleus to trap any invasive moisture to make it difficult to release the moisture to the outside. A semiconductor laser chip, light-receiving element and the like are provided ahead of the end of the optical fiber and a wiring layer, wires and the like are provided around the same. Therefore, any moisture trapped by the bubble 10 can cause oxidation and corrosion of those parts to reduce the humidity resistance of the optical module.

With moisture trapped at the region of a bubble, the moisture can be frozen when the optical module is exposed to a temperature below the freezing point, which can cause troubles attributable to a resultant change in the volume.

As shown in FIGS. 26A, 26B, 27A and 27B, an experiment was conducted in which a metal frame 16 was placed on the bottom of a container 15; two capillaries 17 made of glass (having an inner diameter of 0.13 mm) were arranged thereon in parallel and in contact with each other; and the interior of the container 15 was filled with silicone gel 6 to cover the surface and interior of the capillaries 17 such that no bubble was involved. Thereafter, the container 15 was kept under certain curing process conditions (a processing temperature of 120° C. and a processing time of 60 minutes). FIGS. 26A and 26B are schematic views showing the distribution of bubbles 10 in the silicon gel set under the curing process conditions. FIG. 26A is a plan view, and FIG. 26B is a sectional view.

After the silicone gel was set, environmental tests such as temperature cycles were conducted. Specifically, (1) 40 cycles of about 35 minutes at a temperature in the range from −40 to +85° C., (2) 136 hours at a high temperature and humidity (a temperature of 85° C. and a relative humidity of 85%), (3) high temperature baking (120° C.) for 30 minutes and (4) storage at a low temperature (−55° C.) for 1.5 hours were carried out in the order listed. FIGS. 27A and 27B are schematic views showing the distribution of bubbles 10 generated in the silicon gel during the environmental tests including temperature cycles. FIG. 27A is a plan view, and FIG. 27B is a sectional view.

The bubbles 10 in FIGS. 26A, 26B, 27A and 27B are illustrations based on photographs which represent accurate positions, although the shapes of the bubbles may be slightly different from the real ones.

As shown in FIGS. 26A and 26B, the bubbles 10 are dispersed across the inner diameter of the capillaries 17, but there is no bubble at both ends of the capillaries 17. The reason is assumed to be the fact that the silicone gel can freely move in and out the capillary 17 at both ends thereof (open regions), and it is assumed that cavities or bubbles 10 are generated at inner diameter regions deep in the capillaries 17 because the movement of silicone gel in such regions is not sufficient to compensate for a reduction of the volume attributable to contraction.

Further, as shown in FIGS. 27A and 27B, since the capillaries are repeatedly exposed to varying temperature and humidity during the environmental tests, new cavities are generated as the silicone gel moves to increase bubbles 10. It is assumed that the shapes of bubbles 10 change as a result of integration or separation of cavities adjacent to each other. Bubbles had greater configurations and were subjected to great positional shifts at a high temperature of 120° C., and many small bubbles were generated at a low temperature of −55° C.

FIGS. 27A and 27B show that new bubbles 10 were generated in a region where no bubble 10 had existed as shown in FIGS. 26A and 26B, specifically, the region surrounded by the metal frame 16 and the two capillaries 17 (the enclosed region 9).

It was found that when the interior of the plastic case was sealed with silicone gel to over the surface of components on the support substrate 1 including the semiconductor laser chip 7, bubbles 10 might be generated not only in the silicon gel 6 filled in the groove 2 under the optical fiber 3 as shown in FIG. 28 but also between the end face (front incidence surface) of the optical fiber 1 and the semiconductor laser chip 7.

The reason is assumed to be the fact that the gap between the end face of the optical fiber 3 and the front emission surface of the semiconductor laser chip 7 does not act as an open region because it is as small as 40 to 50 μm and that the gap is likely to generate bubbles when heated repeatedly. Specifically, while no bubble 10 was observed at the gap between the end face of the optical fiber 3 and the front emission surface of the semiconductor laser chip 7 at an early stage when the silicone gel 6 had been filled and set after assembly, the phenomenon of generation of bubbles 10 at the gap between the end face of the optical fiber 3 and the front emission surface of the semiconductor laser chip 7 occasionally occurred after the heat cycle test.

When a bubble 10 is generated at the gap between the end face of the optical fiber 3 and the semiconductor laser chip 7 to come into the optical path of laser light 11 emitted from the emission surface of the semiconductor laser chip 7 (see FIGS. 29 and 30), since the bubble 10 acts as an lens, the direction of the laser light 11 emitted by the semiconductor laser chip 7 is changed (eclipsed) to disallow optical coupling to the optical fiber 3 or to reduce the efficiency of optical coupling. When the optical fiber 3 is a single mode fiber whose core 3a has a diameter as small as about 10 μm, optical coupling is often disabled. Reference number 31 in FIGS. 28 through 30 represents a light-receiving element 31 for receiving the laser light 11 emitted from the rear emission surface of the semiconductor laser chip 7. In FIG. 30, the silicone gel 6 is present on the entire upper surface of the support substrate 1.

It is an object of the invention to provide a photoelectronic device with high optical coupling efficiency and a method of manufacturing the same.

It is another object of the invention to provide a photoelectronic device in which an optical fiber is secured with high strength and reliability and a method of manufacturing the same.

It is still another object of the invention to provide a photoelectronic device having excellent humidity resistance and a method of manufacturing the same.

It is still another object of the invention to provide a photoelectronic device in which an optical fiber can be secured in a shorter working time and a method of manufacturing the same.

It is still another object of the invention to provide a photoelectronic device which can be manufactured at a reduced cost and a method of manufacturing the same.

The above and other objects and novel features of the invention will become apparent from the description of this specification and the accompanying drawings.

Typical aspects of the invention disclosed here can be briefly described as follows.

(1) There is provided a photoelectronic device comprising a support substrate (silicon platform) constituted by a mounting portion for mounting a photoelectric conversion element (semiconductor laser chip) on one surface thereof and a silicon substrate having a groove for guiding an optical fiber extending toward the mounting portion, a photoelectric conversion element secured on the mounting portion and an optical fiber fitted in the groove at one end thereof and secured on the support substrate at regions excluding the utmost end thereof, wherein the optical fiber fitted in the groove is secured with a first bonding element injected to fill the groove under the optical fiber for preliminary securing the optical fiber on the support substrate and a second bonding element for finally securing the optical fiber on the support substrate while covering a part of the optical fiber and support substrate and wherein a protective element transparent to light transmitted by the optical fiber covers a region including the photoelectric conversion element on one surface of the support substrate and one end of the optical fiber. The second bonding element covers all or a part of the region where the first bonding element exists. The first bonding element is constituted by an ultraviolet-setting adhesive, and the second bonding element is constituted by thermosetting resin. The support substrate is secured in a case made of plastic having a guide for guiding the optical fiber. The case is filled with the protective element to cover the support substrate, photoelectric conversion element, optical fiber and the like. The case is closed with a cap made of plastic and is secured on the support substrate with an adhesive. The protective element is constituted by any of silicone gel, silicone rubber, low-stress epoxy resin, acrylic resin or urethane resin. For example, it is constituted by silicone gel. With this configuration, bubbles in sizes equal to or greater than one half of the distance between the two points of the groove in contact with the circumferential surface of the optical fiber are not present in the region defined by the optical fiber and groove and the region between one end face of the optical fiber and the semiconductor laser chip.

This configuration is characterized by the preliminary securing and final securing referred to as "first securing" and "second securing", respectively. In a certain limited aspect, it may be stated that the optical fiber is secured on the support substrate using first and second securing techniques (means) having different securing speeds and that the securing speed of the first securing means is higher than that of the second securing means.

Such a photoelectronic device is manufactured according to the following method.

The method comprises the steps of:
providing a support substrate having a photoelectric conversion element mounted thereon and having a groove for guiding an optical fiber extending toward the photoelectric conversion element;

applying an ultraviolet-setting adhesive to a part of the groove on the support substrate, fitting one end of the optical fiber in the groove on the support substrate and adjusting optical coupling between the photoelectric conversion element and optical fiber with the groove under the optical fiber filled with the ultraviolet-setting adhesive;

preliminary securing the optical fiber on the support substrate by irradiating the ultraviolet-setting adhesive with ultraviolet light to set it; and covering a part of the optical fiber and support substrate with thermosetting resin and setting the thermosetting resin to finally secure the optical fiber on the support substrate.

Specifically, it is a method of manufacturing a photoelectronic device comprising:

a package constituted by a case made of plastic having a guide for guiding an optical fiber and a cap made of plastic for closing the case, attached to the case with an adhesive;

a support substrate secured in the case having a photoelectric conversion element mounted on one surface thereof and having a groove for guiding an optical fiber extending toward the photoelectric conversion element and an optical fiber guided by the guide into and out of the package, wherein one end of the optical fiber extending in the package is fitted in the groove on the support substrate and is secured on the support substrate through preliminary securing with an ultraviolet-setting adhesive and final securing with thermosetting resin. The method comprises the steps of:

applying the ultraviolet-setting adhesive to a part of the groove on the support substrate, fitting one end of the optical fiber in the groove on the support substrate and adjusting optical coupling between the photoelectric conversion element and optical fiber with the groove under the optical fiber filled with the ultraviolet-setting adhesive;

preliminary securing the optical fiber on the support substrate by irradiating the ultraviolet-setting adhesive with ultraviolet light to set it;

covering a part of the optical fiber and support substrate with thermosetting resin and setting the thermosetting resin to finally secure the optical fiber on the support substrate; and filling the case with a protective element transparent to light transmitted by the optical fiber before mounting the case and setting the same. The protective element is constituted by any of silicone gel, silicone rubber, low-stress epoxy resin, acrylic resin or urethane resin. For example, sillicon gel is used. Securing is carried out by determining positions for the preliminary securing and/or final securing such that all or a part of the preliminary securing portion is covered by the final securing portion. The process of setting the thermosetting resin at the final securing is performed as a batch process.

A structure may be employed in which an optical fiber is secured on a support substrate with only a first bonding element. Specifically, there may be provided a photoelectronic device comprising a support substrate constituted by a mounting portion for mounting a photoelectric conversion element on one surface thereof and a support substrate having a groove for guiding an optical fiber extending toward the mounting portion, a photoelectric conversion element secured on the mounting portion and an optical fiber fitted in the groove and secured on the support substrate at regions excluding the utmost end thereof, the device having a structure wherein the optical fiber fitted in the groove is secured with a first bonding element injected to fill the groove under the optical fiber for securing the optical fiber on the support substrate and wherein a protective element transparent to light transmitted by the optical fiber covers a region including the photoelectric conversion element on one surface of the support substrate and one end of the optical fiber. In this case, the first bonding element is constituted by an ultraviolet-setting adhesive or thermosetting resin. Thus, after the ultraviolet-setting adhesive is applied to the groove on the support substrate, optical coupling between the photoelectric conversion element and optical fiber is adjusted with the groove under the optical fiber filled with the ultraviolet-setting resin.

(2) In the configuration described in the aspect (1), the support substrate, photoelectric conversion element and the end of the optical fiber are covered by a package constituted by insulating resin formed by molding resin, and the protective element is provided in the package to block the path of moisture that enters the photoelectric conversion element from the outside of the package.

According to the aspect (1), (a) while the package is formed by a case and a cap made of plastic, humidity resistance can be improved because the case is filled with silicone gel.

(b) When the optical fiber is fitted in the groove on the silicon platform (support substrate), a space is defined by the groove under the optical fiber. This space is filled with the ultraviolet-setting adhesive. Therefore, the silicone gel does not enter the region under the optical fiber associated with the preliminary securing portion when the case is filled with the silicone gel before sealing with the cap, and no bubble is caused by the setting and contraction of the silicone gel. This makes it possible to prevent any reduction in the strength and reliability of the securing of the optical fiber 3 attributable to bubbles and to prevent problems such as freezing of moisture trapped by bubbles.

Specifically, even if moisture enters from the outside along the optical fiber, since the gap between the optical fiber and groove at the preliminary securing portion is filled with the ultraviolet-setting adhesive for preliminary securing, the invasion of moisture is prevented at the preliminary securing portion, and there is no nucleus like a bubble in the silicone gel that can trap moisture. This prevents trapping of moisture to improve humidity resistance and eliminates the possibility of freezing of moisture during use at a low temperature.

In the structure in which the optical fiber is secured on the support substrate using only a first bonding element constituted by an ultraviolet-setting adhesive or thermosetting resin, since the groove under the optical fiber is filled with the first bonding element, the silicone gel does not enter the groove region under the optical fiber, and this also prevents the generation of bubbles attributable to the setting and contraction of the silicone gel.

Further, only a small amount of silicone gel enters the groove under the end portion of the optical fiber because the end portion protruding from the region secured using the first bonding element is as short as several hundred $\mu$m, and a region open to the atmosphere exists ahead the end of the optical fiber. Thus, the silicone gel moves when it sets and contracts, which suppresses the generation of bubbles. This not only prevents the generation of bubbles in the silicone gel at the end of the optical fiber and under the same to eliminate nuclei to trap moisture but also eliminates bubbles from the gap between the semiconductor laser chip and optical fiber. This prevents eclipse of laser light attributable to bubbles to allow optical coupling of the optical fiber with high efficiency.

Even if bubbles are generated in the silicone gel in the groove under the optical fiber, such bubbles have small diameters.

(c) After the adjustment of optical coupling, the optical fiber is preliminary secured to the region of the groove on the silicon platform with the ultraviolet-setting adhesive and is thereafter subjected to final securing with the thermosetting resin. This improves the reliability of optical coupling.

(d) Since the thermosetting resin has high bonding strength, the optical fiber is reliably secured to the silicon platform through the final securing using the thermosetting resin, and the optical fiber is thus secured with improved reliability. The optical fiber is secured at the preliminary securing portion such that the optical coupling between the optical fiber and the semiconductor laser chip is not deteriorated, and the final securing portion improves the securing strength of the optical fiber.

(e) Since preliminary and final securing is carried out as in (c) and (d) above, the optical fiber is secured on the silicon platform with high optical coupling and high reliability of coupling.

(f) When the optical fiber is secured in the groove on the silicon platform, the optical fiber is pressed against the silicon platform after optical coupling between the semiconductor laser chip and optical fiber is adjusted, and the optical fiber is preliminary secured in such a state by applying the ultraviolet-setting adhesive and irradiating the ultraviolet-setting adhesive with ultraviolet light to set it. This makes it possible to reduce the time required for the preliminary securing to several tens seconds.

(g) Since the preliminary securing using the ultraviolet-setting adhesive provides high securing reliability in a short term, the optical coupling between the optical fiber and semiconductor laser chip is not deteriorated during the time interval before the subsequent final securing. Therefore, when the optical fiber is finally secured with the thermosetting resin (epoxy resin) thereafter, the thermosetting process following the application of the thermosetting resin can be carried out on a batch process basis. This makes it possible to improve the efficiency of the operation of securing the optical fiber, thereby achieving a reduction in the manufacturing cost of the photoelectronic device.

(h) The preliminary securing using the ultraviolet-setting adhesive is carried out on a fiber inserting apparatus for aligning the optical axes of the semiconductor laser chip and optical fiber. Since the time for the preliminary securing of the optical fiber is reduced (to several tens seconds), the operating efficiency of the fiber inserting apparatus can be improved.

(i) Since a fiber inserting apparatus is expensive, improved operating efficiency of a fiber inserting apparatus results in a reduction of the manufacturing of the photoelectronic device.

In the aspect (2) described above, there is the following effect in addition to the effects according to the aspect (1). In this aspect, it is possible to achieve high productivity and to reduce the manufacturing cost of a photoelectronic device because the package is formed by molding insulating resin.

BRIEF DESCRIPTIONS OF THE DRAWINGS

Figure 4:
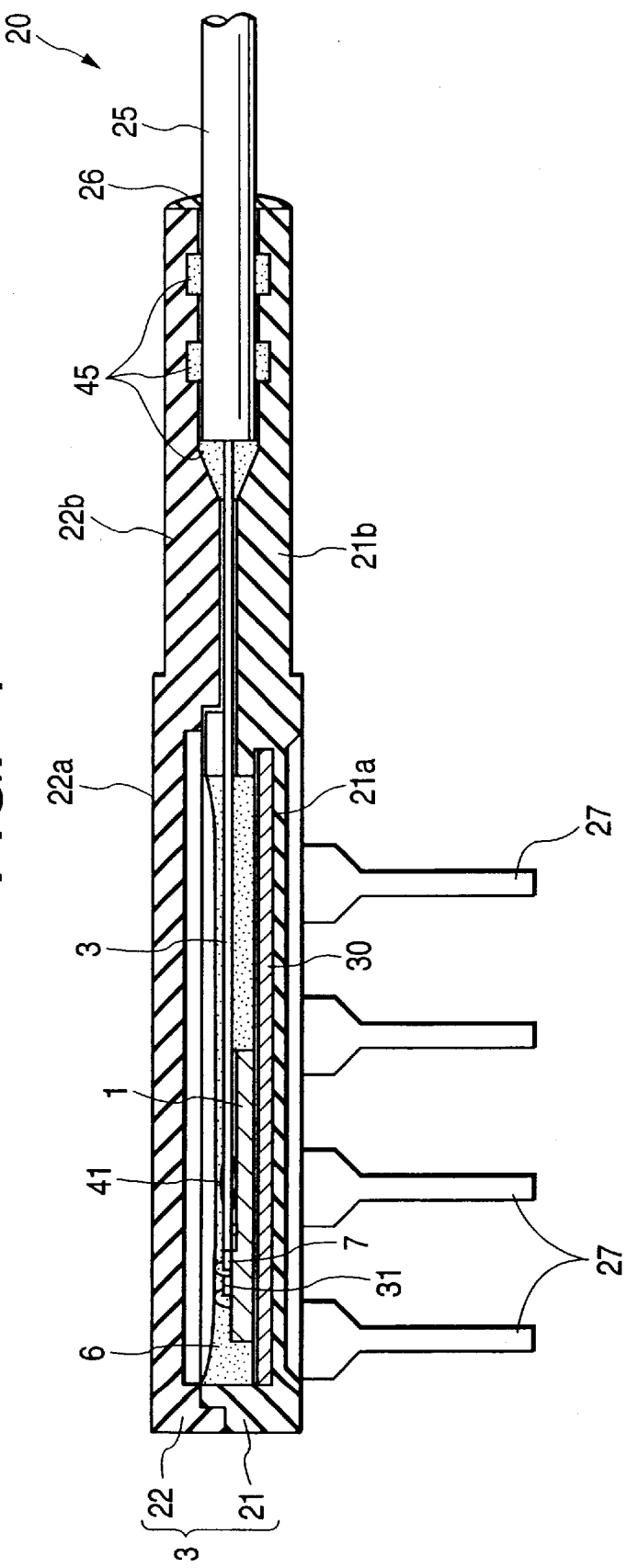

FIG. 4 an enlarged sectional view of the photoelectronic device of the first embodiment taken in the extending direction of an optical fiber.

Figure 5:
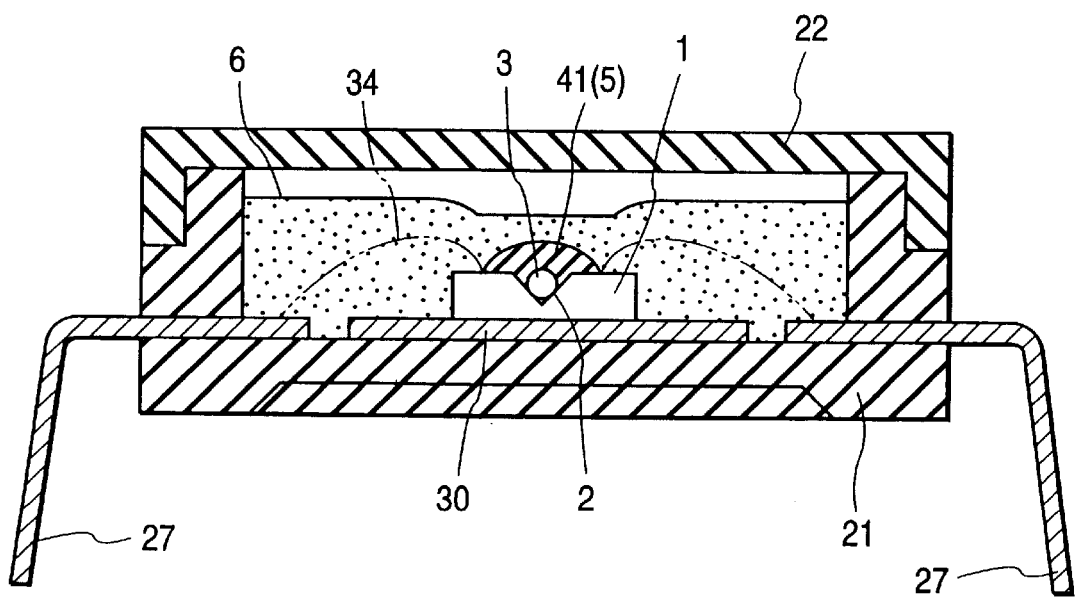

FIG. 5 is an enlarged sectional view of the photoelectronic device of the first embodiment taken in the direction perpendicular to the optical fiber.

Figure 6:
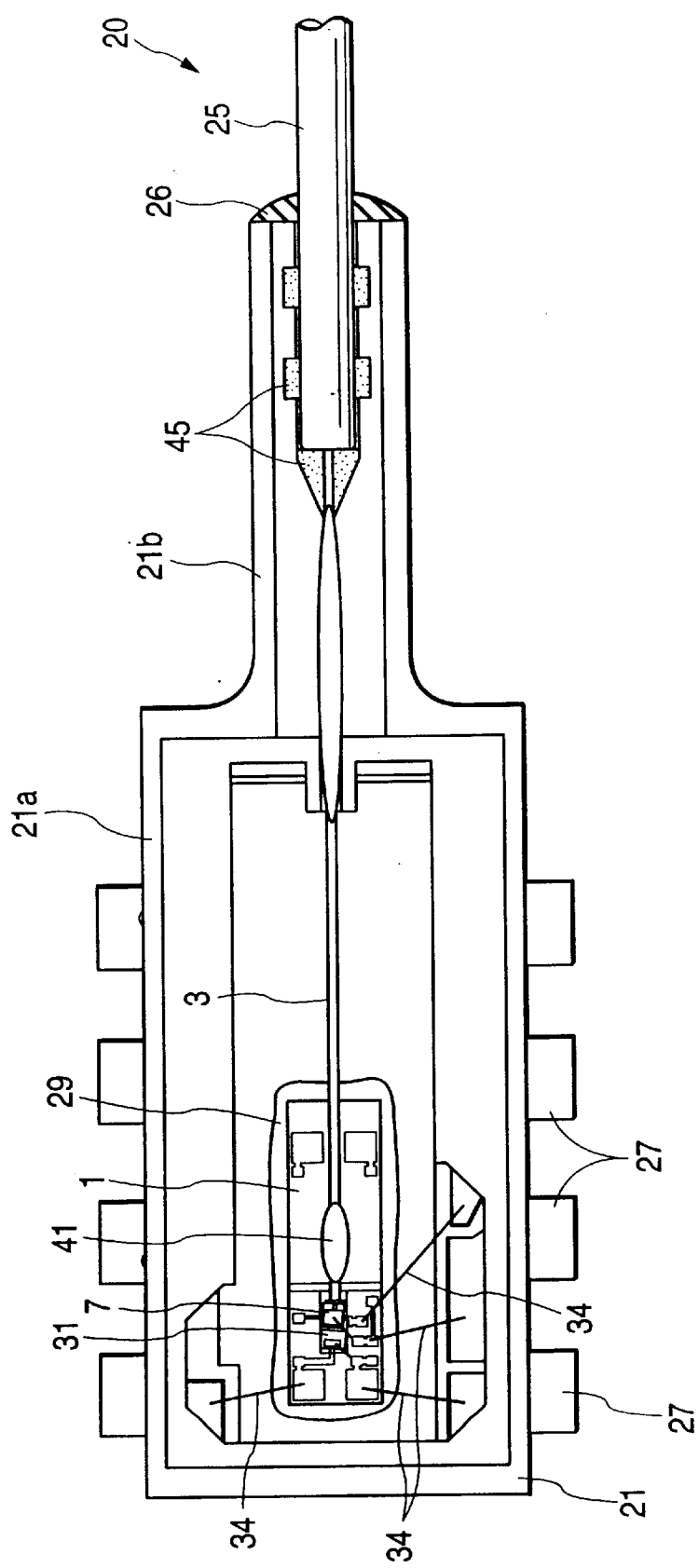

FIG. 6 is an enlarged plan view of the photoelectronic device of the first embodiment with the cap removed.

Figure 7:
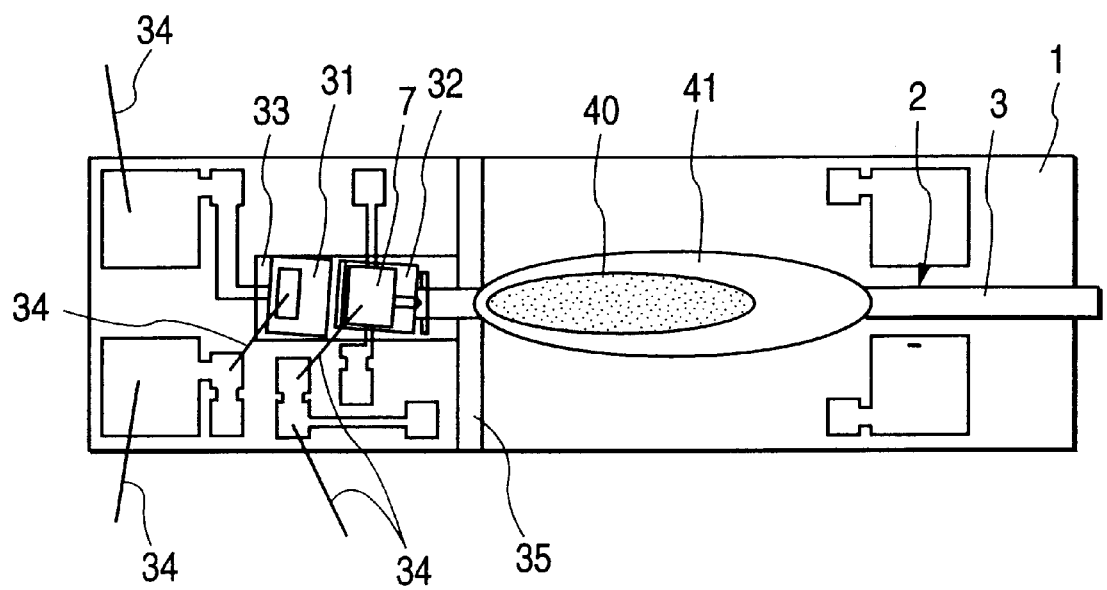

FIG. 7 is an enlarged plan view of the region of the silicon platform in the photoelectronic device of the first embodiment.

Figure 8:
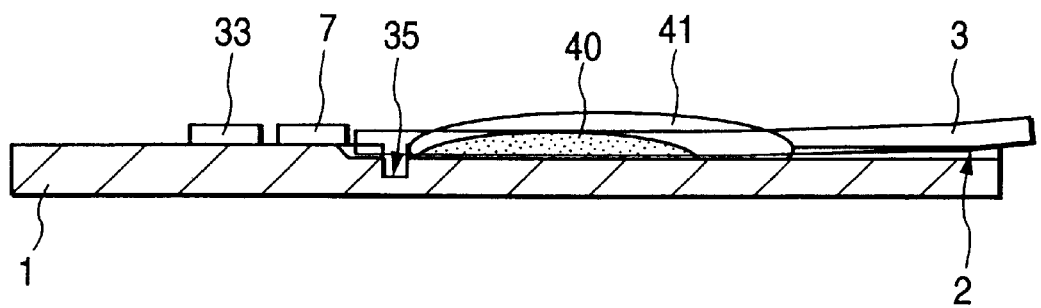

FIG. 8 is an enlarged sectional view of the region of the silicon platform in the photoelectronic device of the first embodiment.

Figure 9A:
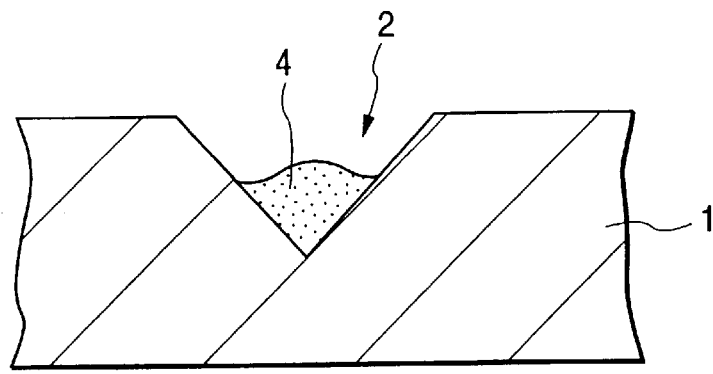
Figure 9B:
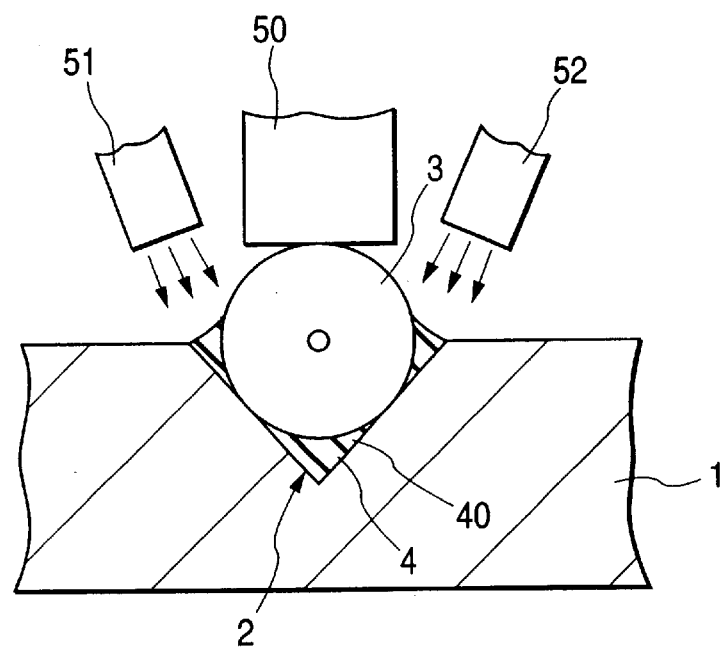
Figure 9C:
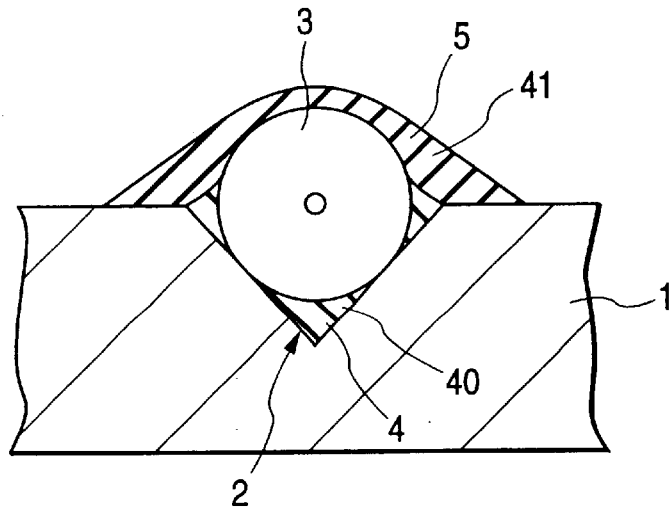

FIGS. 9A, 9B and 9C are schematic sectional views showing a method or securing an optical fiber on the silicon platform during the manufacture of the photoelectronic device of the first embodiment.

Figure 10:
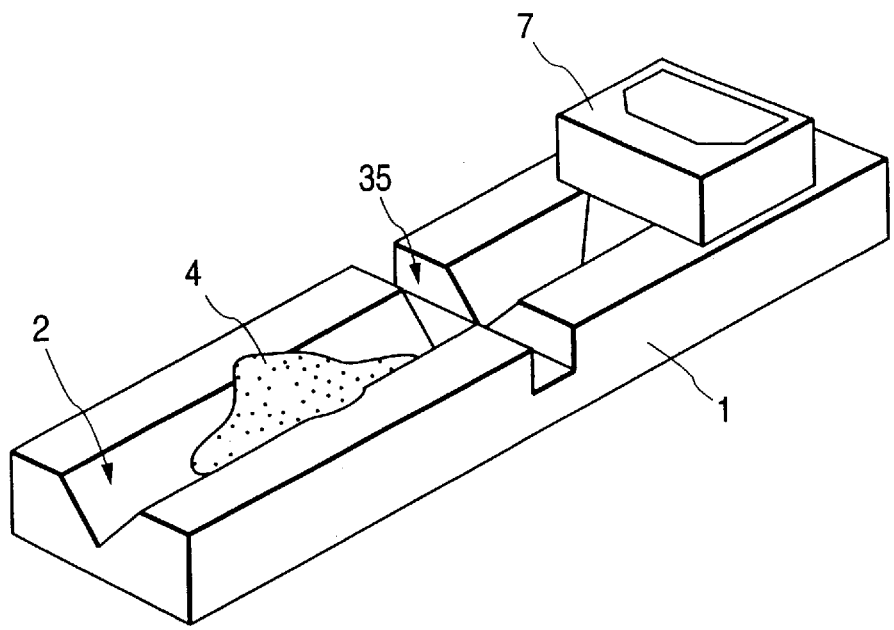

FIG. 10 is a schematic perspective view showing the application of an adhesive to a groove prior to the securing of the optical fiber.

Figure 11:
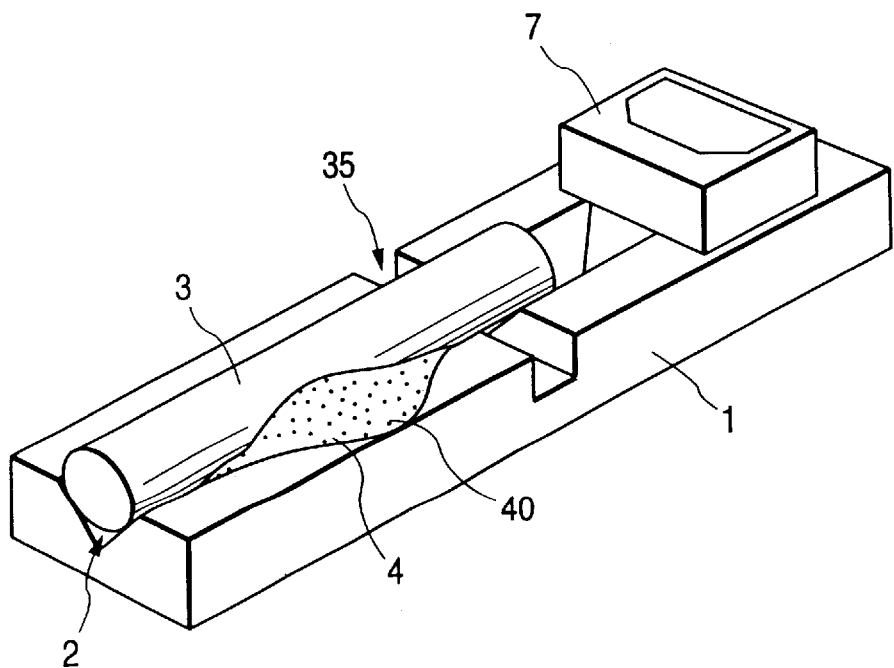

FIG. 11 is a schematic perspective view showing preliminary securing of the optical fiber to the groove.

Figure 12:
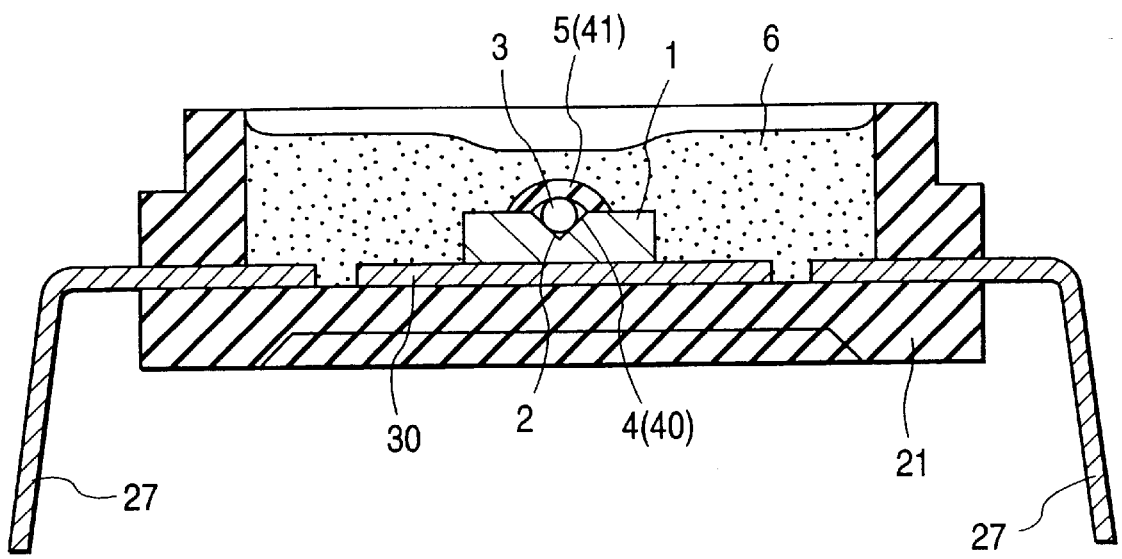

FIG. 12 is an enlarged sectional view showing a state in which silicone gel is injected in the case during the manufacture of the photoelectronic device of the first embodiment.

Figure 13:
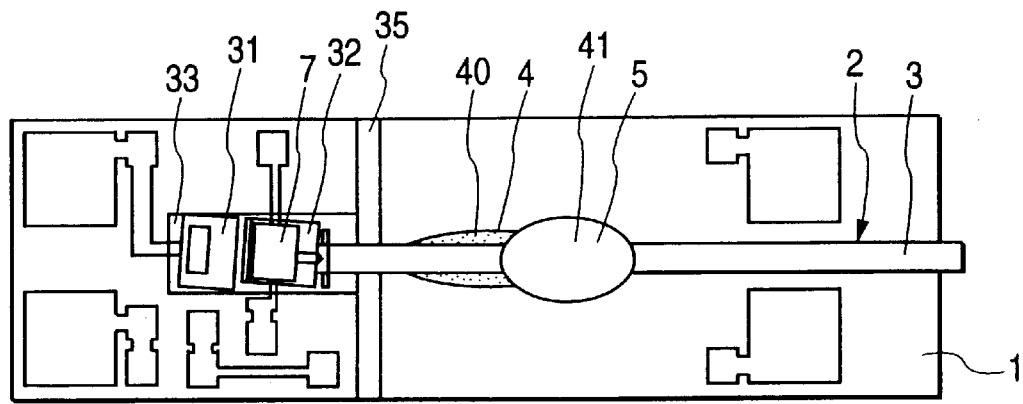

FIG. 13 is an enlarged plan view of the region of a silicon platform in a photoelectronic device which is another embodiment (second embodiment) of the invention.

Figure 14:
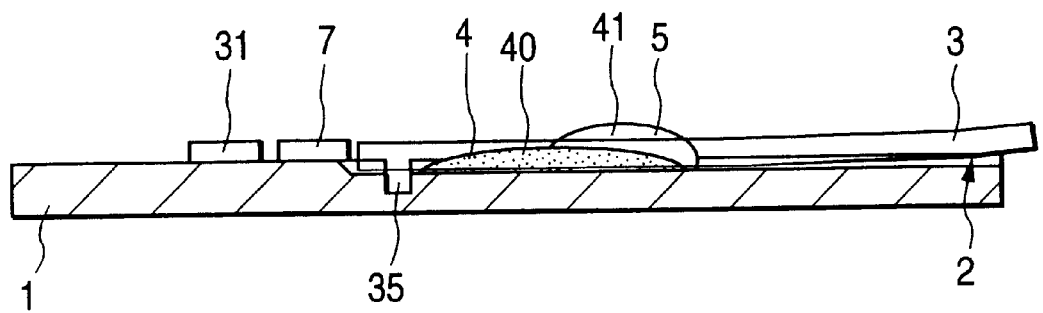

FIG. 14 is an enlarged sectional view of the region of the platform of the photoelectronic device of the second embodiment.

Figure 15:
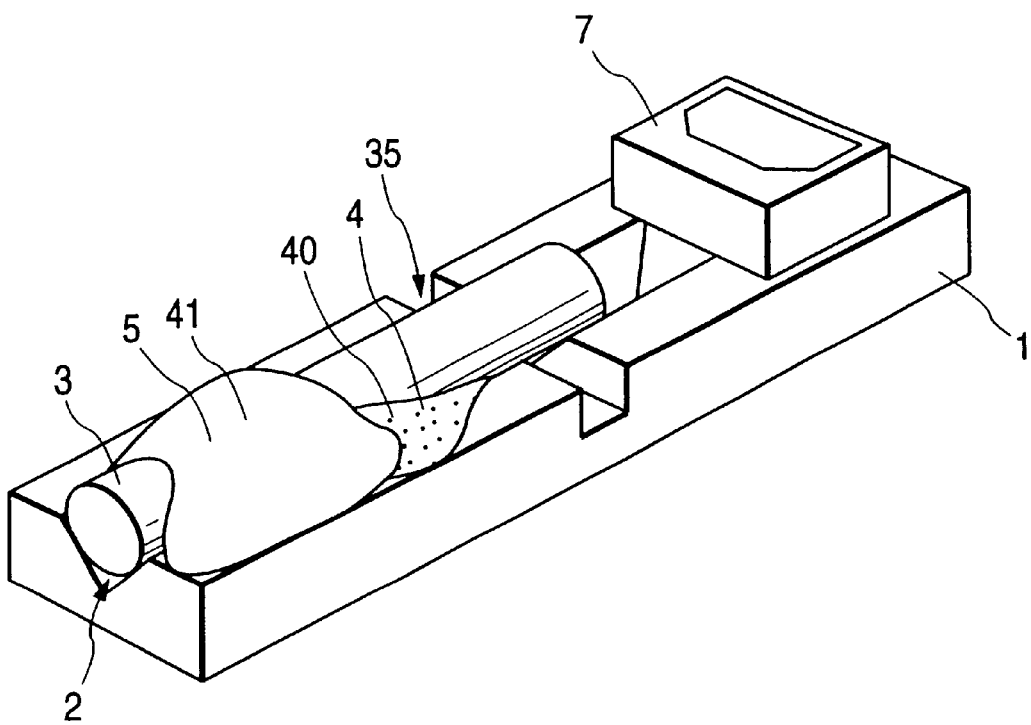

FIG. 15 is a schematic perspective view showing final securing of an optical fiber in a groove on the silicon platform.

Figure 16:
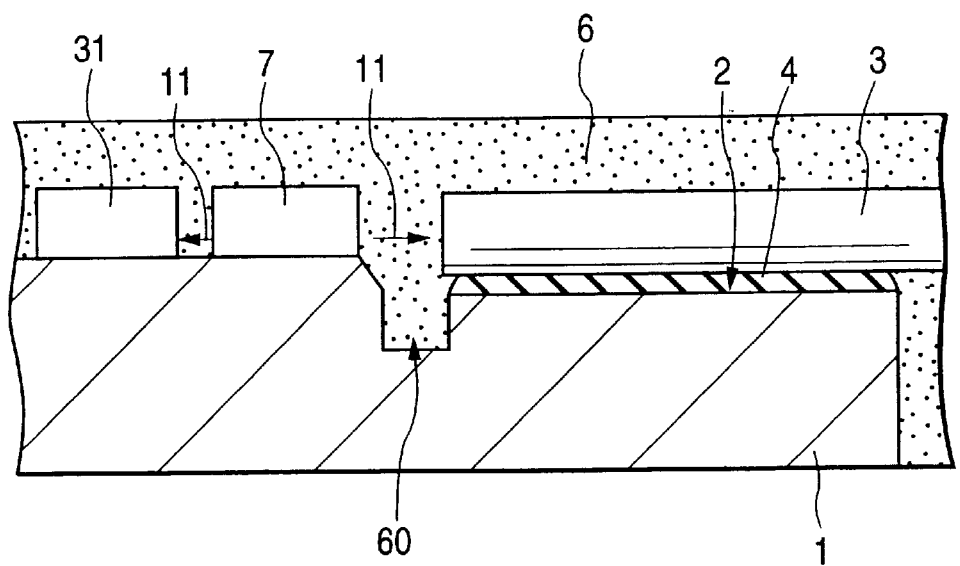

FIG. 16 is a schematic enlarged sectional view of the region of a silicon platform in a photoelectronic device which is another embodiment (third embodiment) of the invention.

Figure 17:
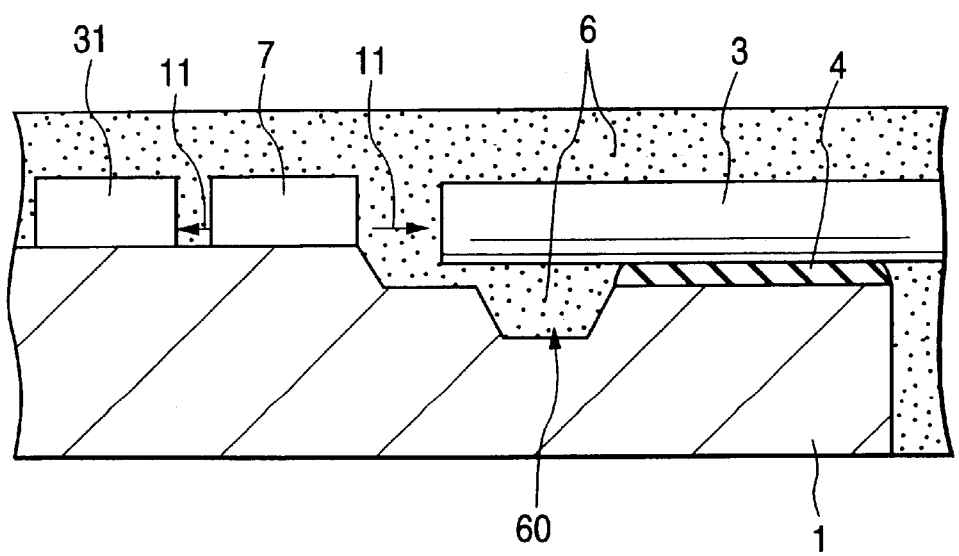

FIG. 17 is a schematic enlarged sectional view of the region of a silicon platform in a photoelectronic device which is another embodiment (fourth embodiment) of the invention.

Figure 18:
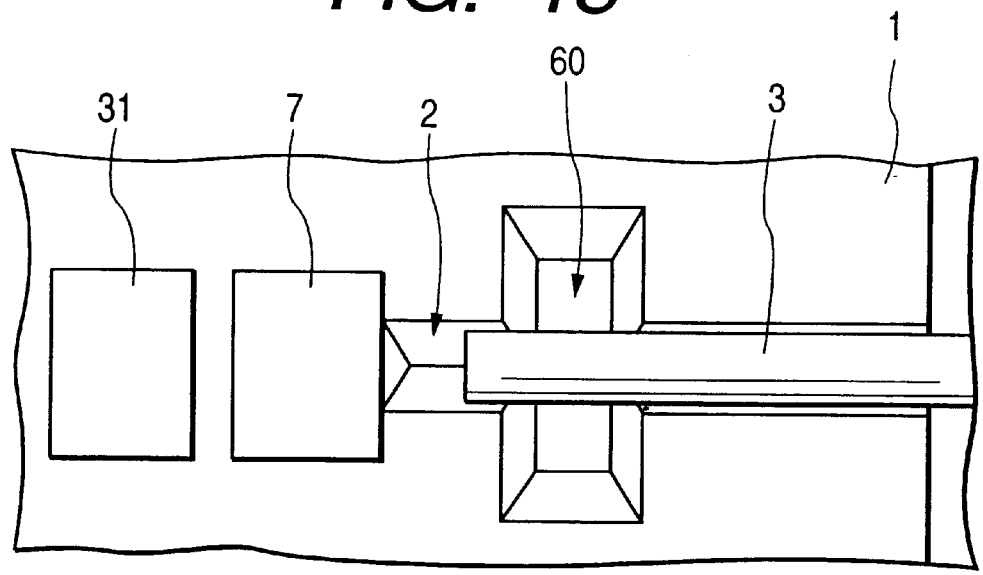

FIG. 18 is a schematic enlarged plan view of the region of the silicon platform in the photoelectronic device of the fourth embodiment.

Figure 19:
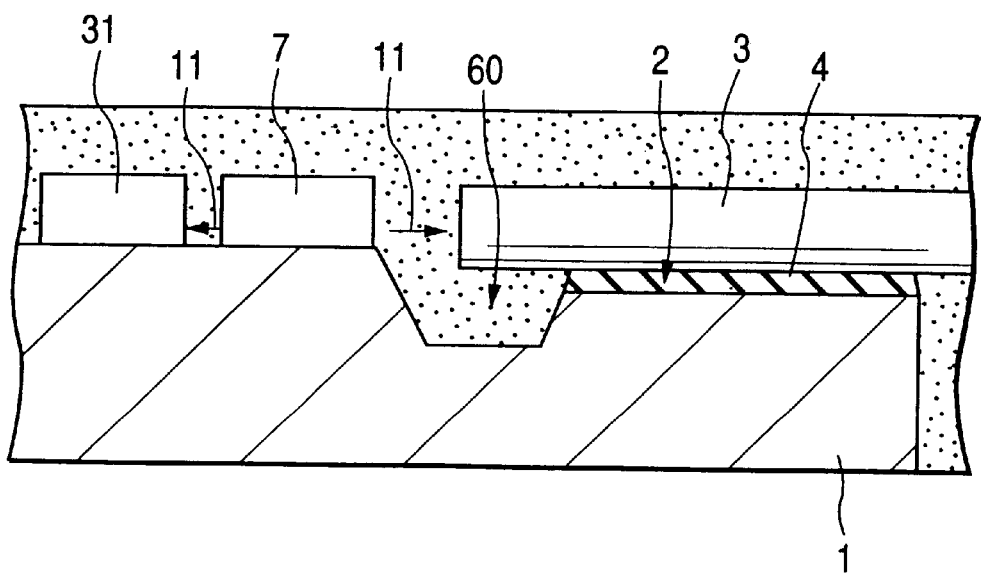

FIG. 19 is a schematic enlarged sectional view of the region of a silicon platform in a photoelectronic device which is another embodiment (fifth embodiment) of the invention.

Figure 20:
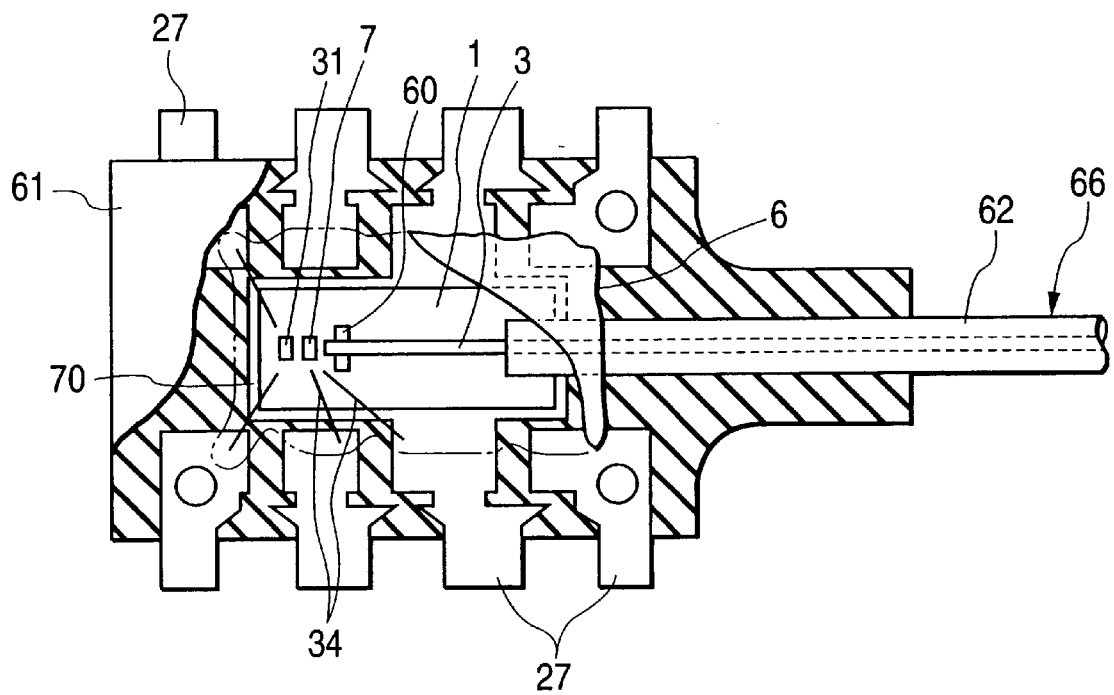

FIG. 20 is a partially cut-away plan view of a photoelectronic device which is another embodiment (sixth embodiment) of the invention.

Figure 21:
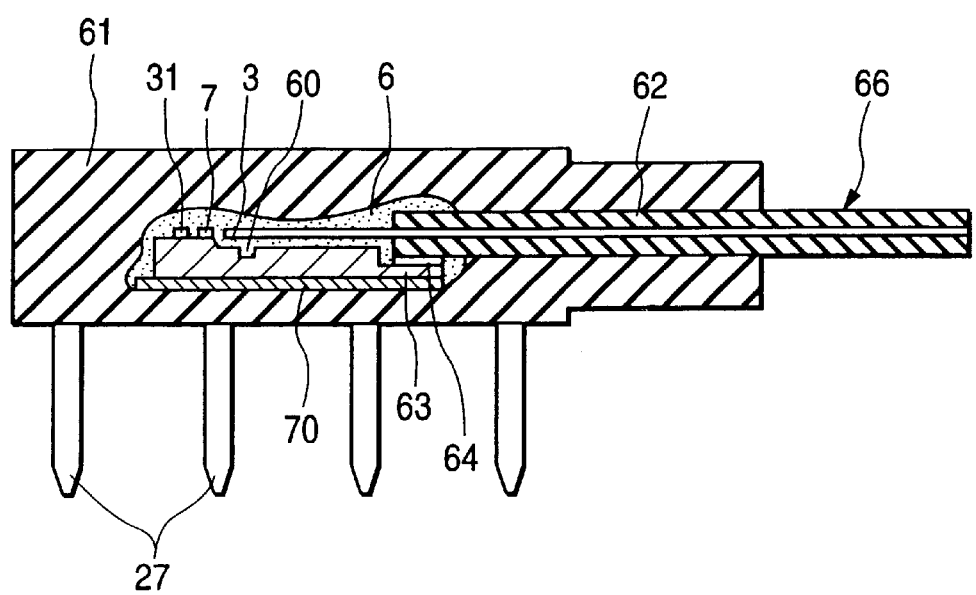

FIG. 21 is a sectional view of the photoelectronic device of the sixth embodiment.

Figure 22:
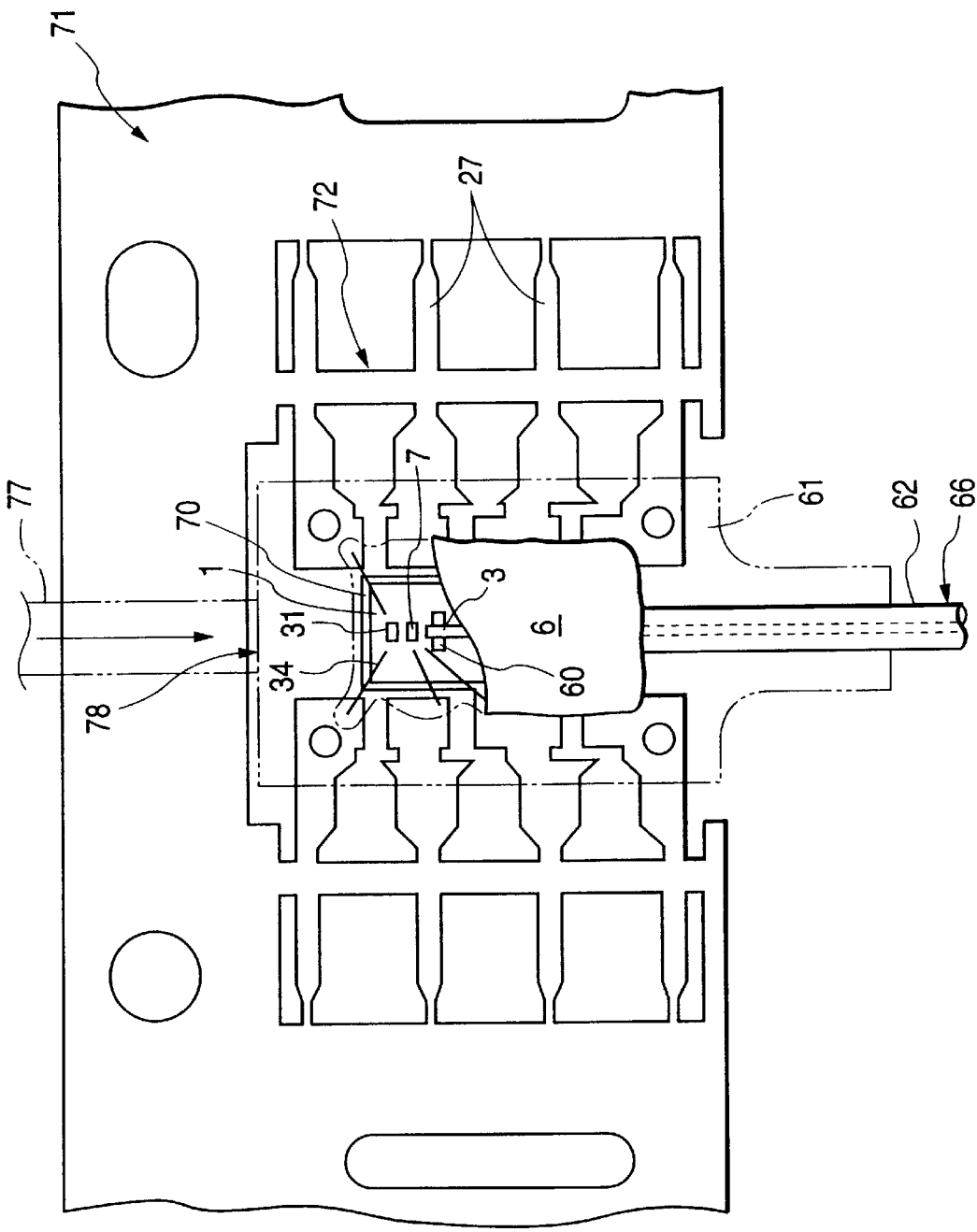

FIG. 22 is a plan view of a part of a lead frame showing the state of the photoelectronic device of the sixth embodiment atone step of manufacturing the same.

Figure 23:
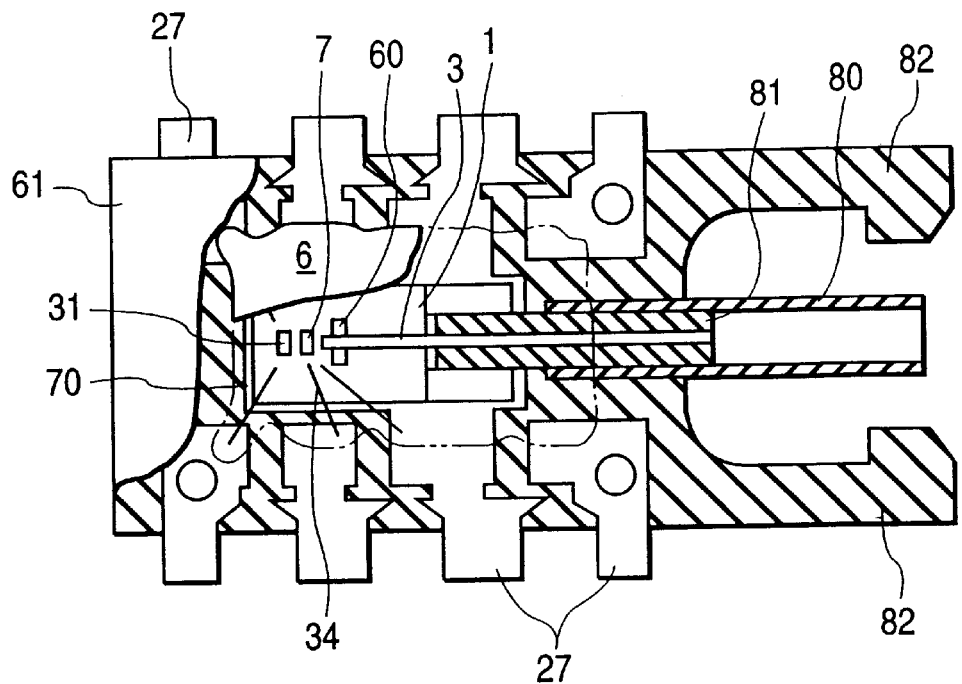

FIG. 23 is a partially cut-away plan view of a photoelectronic device which is another embodiment (seventh embodiment) of the invention.

Figure 24:
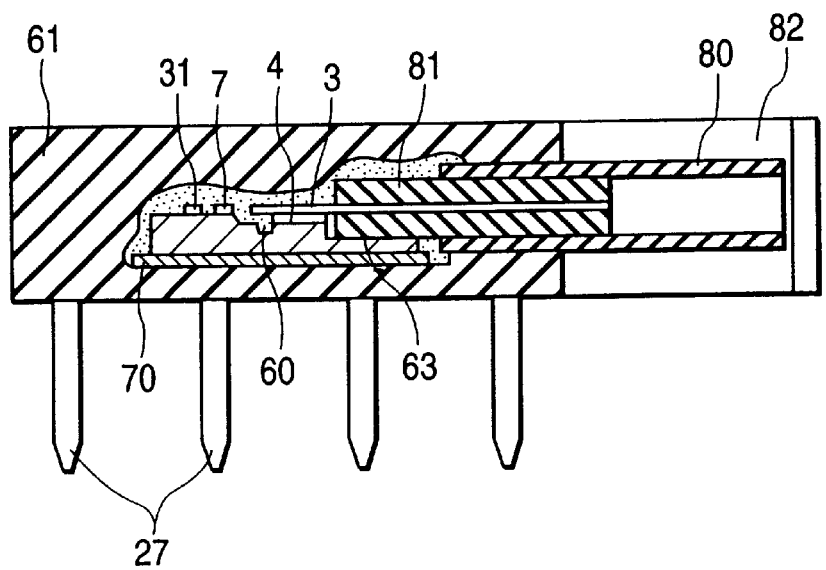

FIG. 24 is a sectional view of the photoelectronic device of the seventh embodiment.

Figure 25:
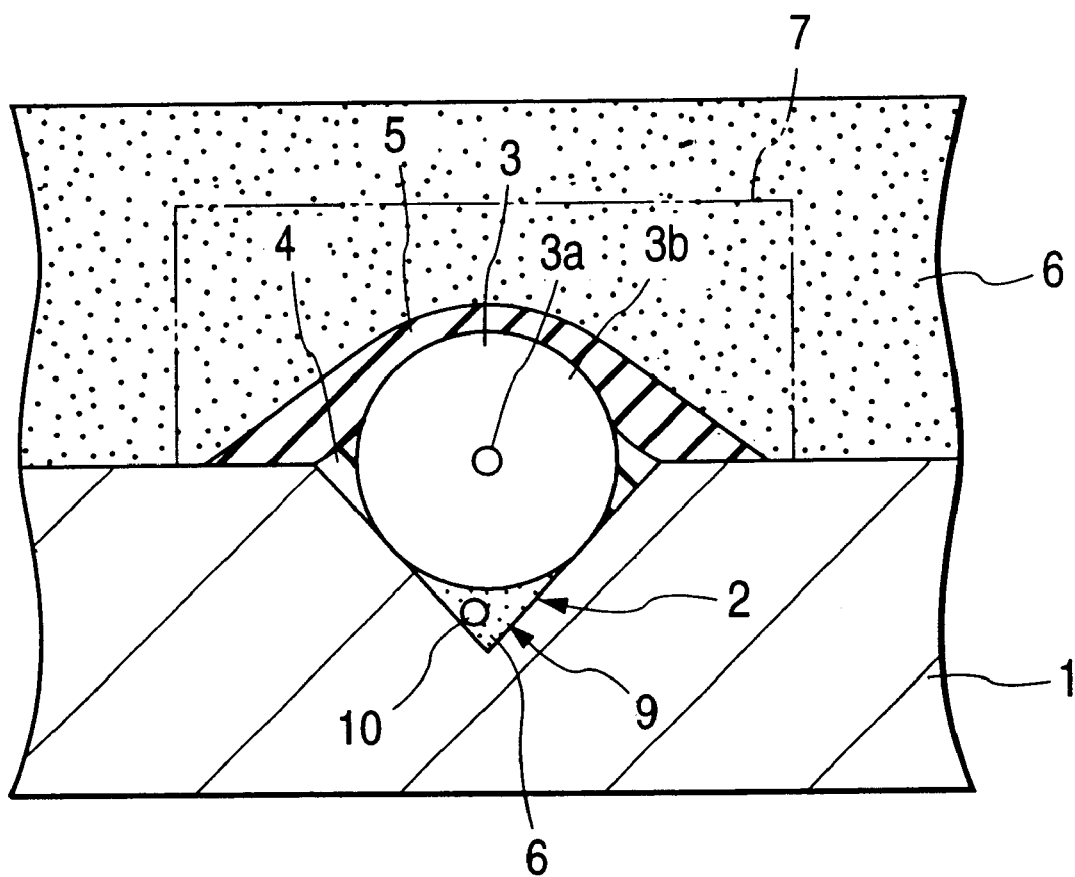

FIG. 25 is a schematic enlarged sectional view showing generation of a bubble in a space defined by an optical fiber and a groove during securing of the optical fiber studied by the inventor.

Figure 26A:
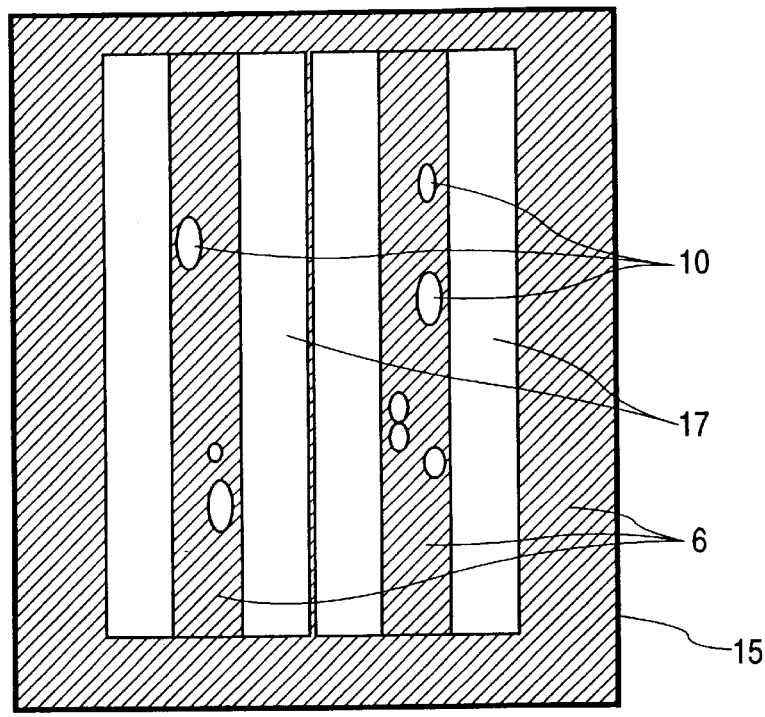
Figure 26B:
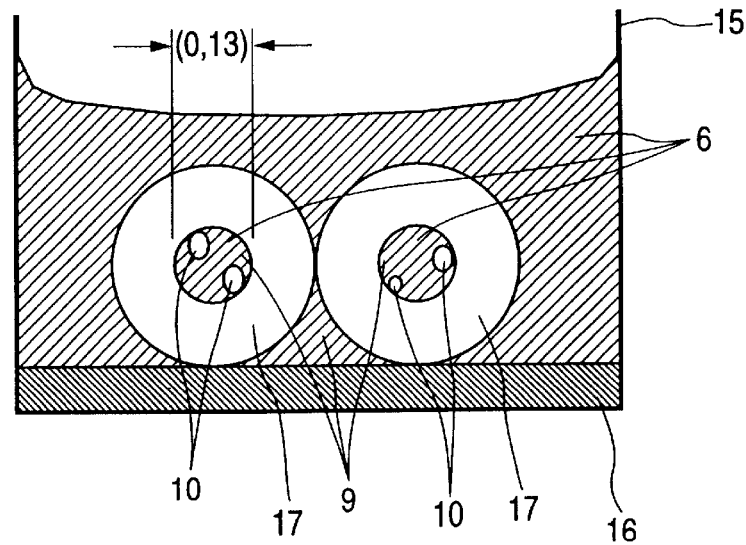

FIGS. 26A and 26B show data obtained from an experiment carried out by the inventor in the form of schematic-views showing the distribution of bubbles generated at an early stage of setting of silicone gel.

Figure 27A:
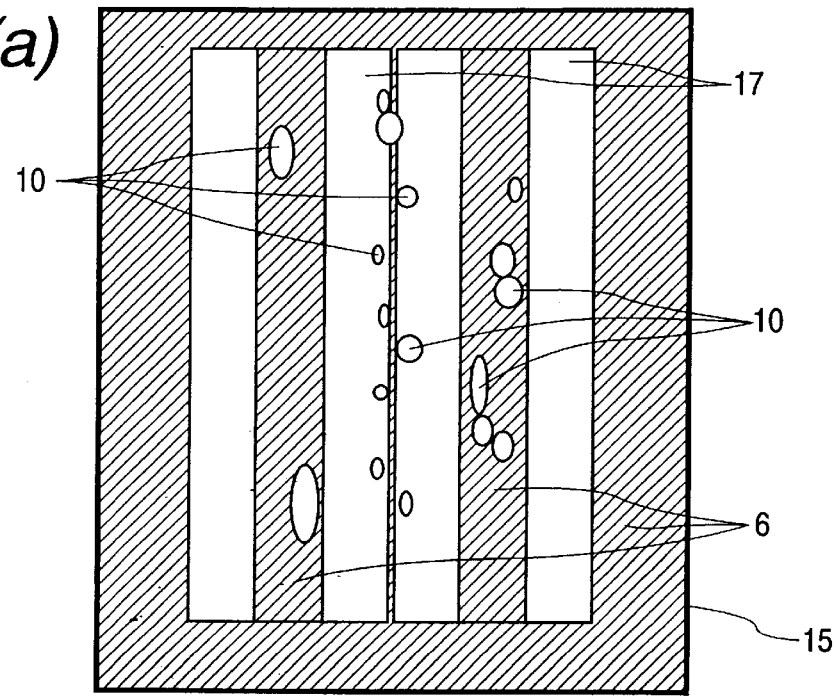
Figure 27B:
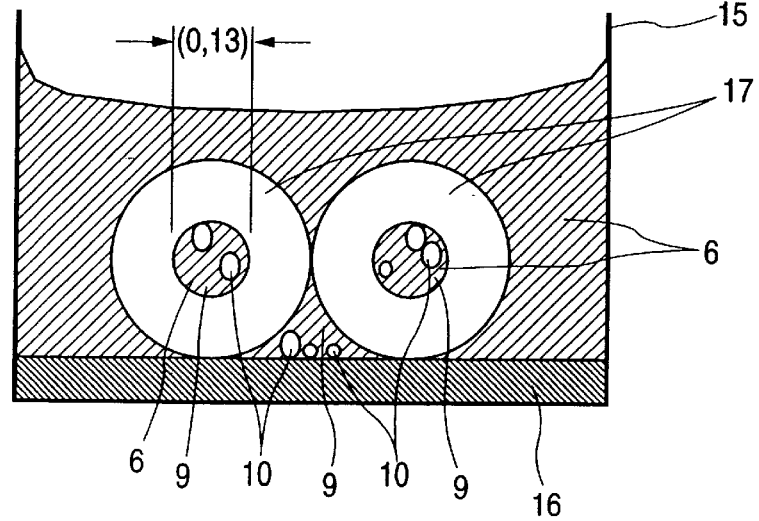

FIGS. 27A and 27B show data obtained from an experiment carried out by the inventor in the form of schematic views showing the distribution of bubbles generated in silicone gel as a result of environmental tests such as temperature cycles.

Figure 28:
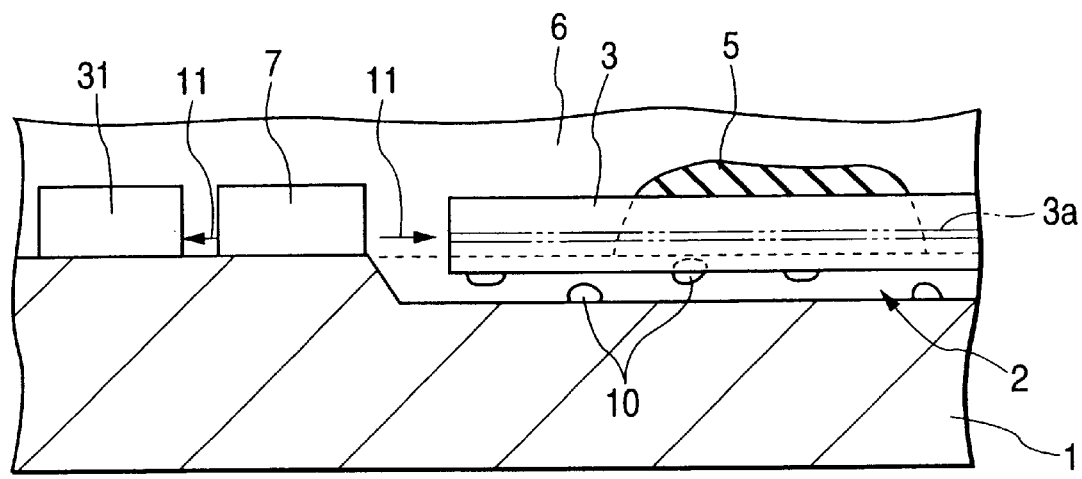

FIG. 28 illustrates a phenomenon observed by the inventor in the form of a schematic sectional view showing bubbles generated in silicone gel in a groove under an optical fiber.

Figure 29:
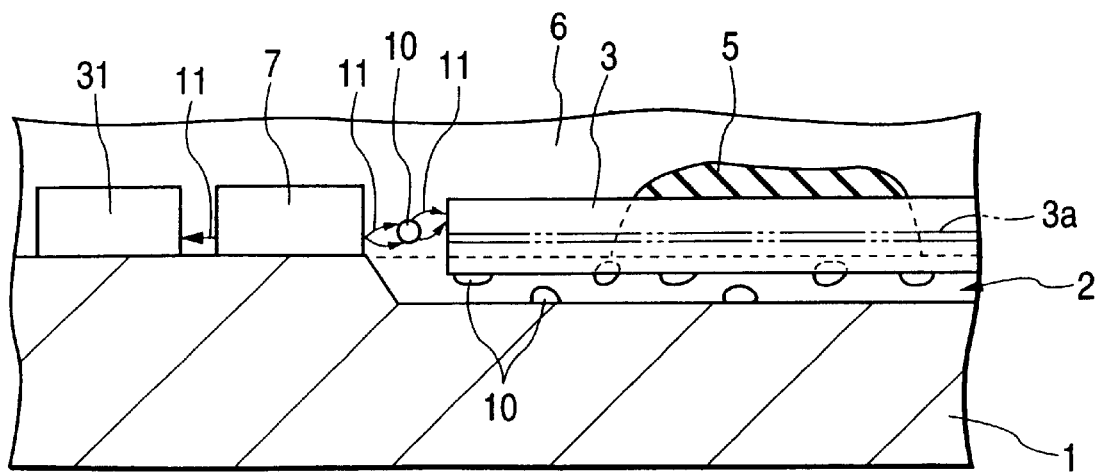

FIG. 29 illustrates a phenomenon observed by the inventor in the form of a schematic sectional view showing bubbles generated in silicone gel in a groove under an optical fiber and in the gap between an end of the optical fiber and a semiconductor laser chip.

Figure 30:
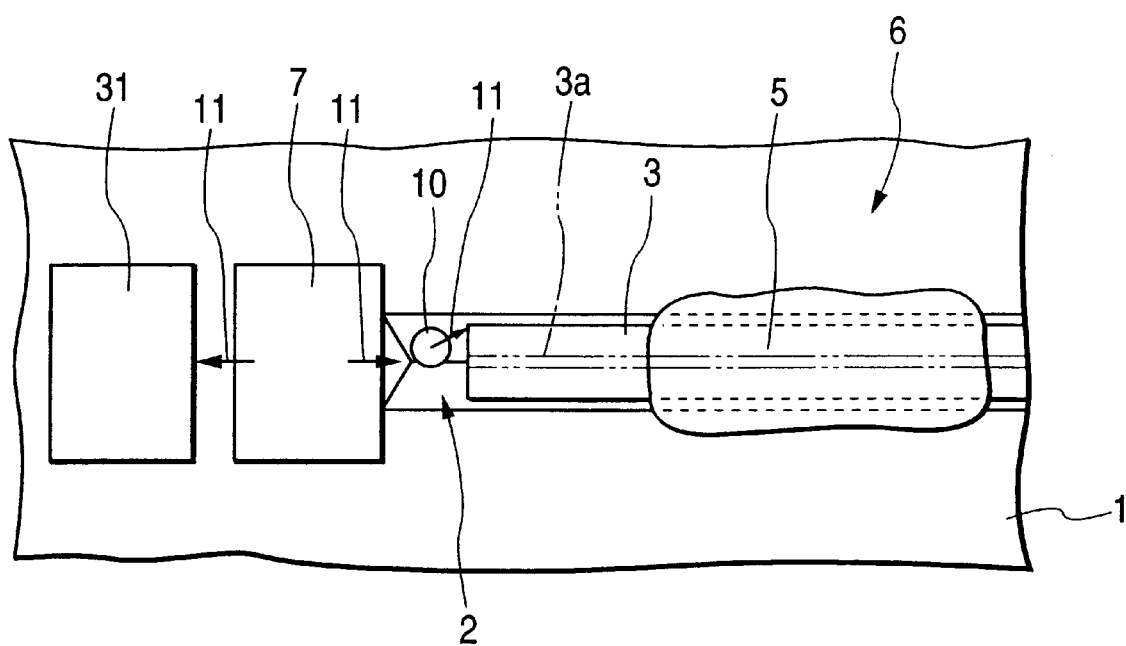

FIG. 30 illustrates a phenomenon observed by the inventor in the form of a schematic plan view showing bubbles generated in the gap between an end of an optical fiber and a semiconductor laser chip.

DESCRIPTIONS OF THE PREFERRED EMBODIMENTS

Preferred embodiments of the invention will now be described in detail with reference to the drawings. Throughout the drawings presented here to describe the preferred embodiments of the invention, parts having like functions are indicated by like reference numbers, and repeated description will be omitted for them.

A first embodiment of the invention will now be described.

FIGS. 1 through 12 are drawings related to a photoelectronic device which is the first embodiment of the invention and a method of manufacturing the same.

Figure 1:
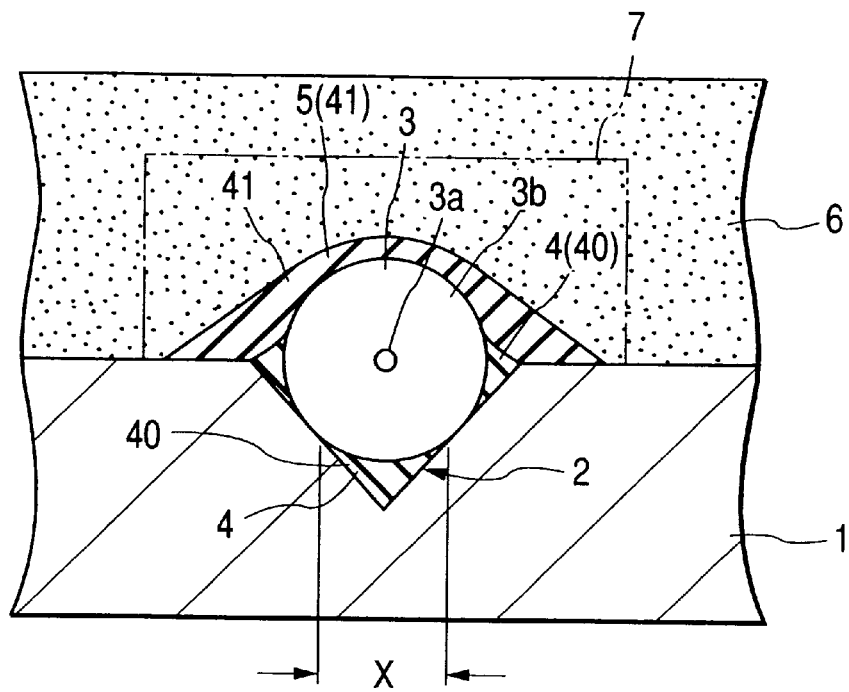
FIG. 1 is an enlarged sectional view of the region of a silicon platform in a photoelectronic device which is an embodiment (first embodiment) of the invention.
Figure 2:
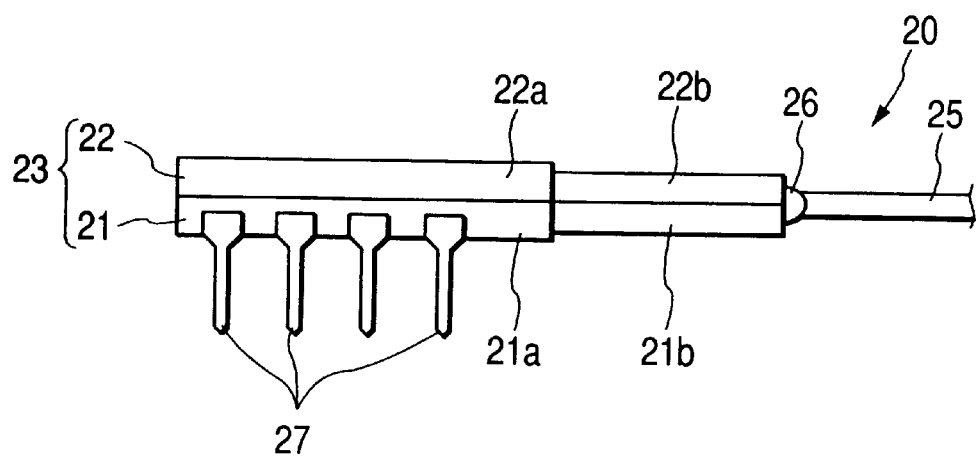
FIG. 2 is a front view of the photoelectronic device of the first embodiment.
Figure 3:
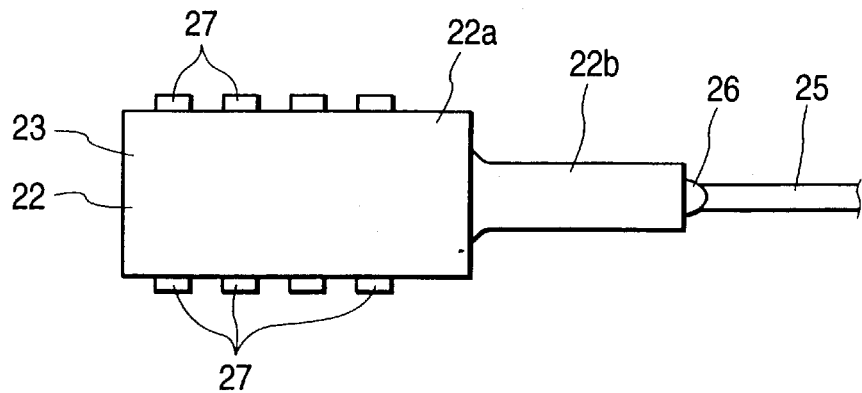
FIG. 3 is a plan view of the photoelectronic device of the first embodiment.

As shown in FIGS. 2 and 3, a photoelectronic device (semiconductor optical module) 20 of the first embodiment comprises a plastic case 21 and a plastic cap 22 secured on the case 22 which collectively form a package (sealing element) 23 when viewed externally. The case 21 and cap 22 are respectively comprised of rectangular main body portions 21a and 22a and elongate guide portions 21b and 22b that protrude from the middle of ends of the main body portions 21a and 22a.

An optical fiber cable 25 is guided by the guide portions 21b and 22b to protrude from the ends of the guide portions 21b and 22b. The region of the optical fiber 25 that protrudes from the guide portions 21b and 22b is secured with an ultraviolet-setting adhesive 26.

A plurality of leads 27 protrude from both sides of the case 21. In the present embodiment, the leads 27 are shaped in a dual inline configuration. The case 21 and cap 22 are made of insulating resin such as epoxy resin. Specifically, the package 23 is constituted by a plastic package made of insulating resin.

FIG. 6 is an enlarged plan view of the semiconductor optical module 20 with the cap 22 removed. FIG. 4 is an enlarged sectional view of the semiconductor optical module 20 taken in the extending direction of the optical fiber. FIG. 5 is an enlarged sectional view of the semiconductor optical module 20 taken in the direction perpendicular to the optical fiber. As shown in those figures, a base plate 30 is provided on the inner bottom of the case 21. The inner end of each lead 27 is located around the base plate 30. The base plate 30 and leads 27 are incorporated in the case 21 when the case 21 is molded.

While the optical fiber cable 25 is guided by the guide portion 21b of the case 21, a silicon platform (support substrate made of silicon single crystals) 1 is secured with a bonding material 29, e.g., silver paste, on the base plate 30 which is located on an imaginary line along which the optical fiber axis of the optical fiber cable 25 extends.

The optical fiber cable 25 is covered by a jacket (fiber jacket) as a protective tube made of, for example, nylon. While the fiber jacket covers halfway the guide portion 21b of the case 21, the fiber jacket is peeled off at the end of this portion to expose an optical fiber 3 comprising a core and a clad. The region of the optical fiber 3 is fitted in a groove 2 provided on the silicon platform 1 so as to trail along it, In this structure, a semiconductor laser chip 7 as a photoelectric conversion element and a light-receiving element (photodiode) 31 are secured in series on the silicon platform 1 that is located on an imaginary line extending from the same.

Laser light emitted from a front emission surface of the semiconductor laser chip 7 is taken into the optical fiber at an end (one end) of the optical fiber 3, and the optical output strength of laser light emitted from a rear emission surface is monitored by the light-receiving element 31.

As shown in FIG. 7, the semiconductor laser chip 7 and light-receiving element 31 are respectively secured to mounting portions 32 and 33 constituted by a conductive metalized layer provided on a surface of the silicon platform 1. Since both of the semiconductor laser chip 7 and light-receiving element 31 have electrodes on upper and lower surfaces thereof, the bonding structure electrically connects the electrodes on the lower surfaces to the mounting portions 32 and 33, respectively. A part of the metalized layer continuous to the mounting portions 32 and 33 and the inner ends of predetermined leads 27 are connected by conductive wires 34.

The electrodes on the upper surfaces of the semiconductor laser chip 7 and light-receiving element 31 are secured to respective independent metalized layers through the conductive wires 34, and a part of the metalized layers is electrically connected to the inner ends of predetermined leads 27 through the wires 34.

A discharge groove 35 is provided such that it crosses the groove 2 provided on one surface of the silicon platform 1. While the optical fiber 3 extends beyond the discharge groove 35, it protrudes beyond the groove only a small distance. For example, the protruding length is about 100 $\mu$m. The diameter of the optical fiber 3 is, for example, about 125 $\mu$m.

As shown in FIGS. 7 and 8, the optical fiber 3 is secured on the silicon platform 1 in the vicinity of the discharge groove 35 using two types of adhesives at a preliminary securing portion 40 and a final securing portion 41. An ultraviolet-setting adhesive 4 is used at the preliminary securing portion 40, and thermosetting resin 5 is used at the final securing portion 41. FIGS. 4 through 6 show only the final securing portion 41 which will be described in detail with reference to other drawings.

One of the features of the invention is that the ultraviolet-setting adhesive 4 that constitutes the preliminary securing portion 40 is located below the optical fiber 3 (FIG. 7 shows the regions of the preliminary securing portion 40 and final securing portion 41 and does not clearly show the vertical positional relationship between them) and is filled in an enclosed region 9 defined by the groove 2 on the silicon platform 1 and the optical fiber 3 such that no gap is produced.

The final securing portion 41 is provided such that it covers the preliminary securing portion 40 as a whole. However, the final securing portion 41 is provided such that it does not exceed the discharge groove 35 as a guide line to prevent it from invading the space between the end of the optical fiber 3 and the semiconductor laser chip 7. The purpose of this is to prevent the final securing portion 41 from blocking the transmission and reception of light.

At the preliminary securing portion 40, the ultraviolet-setting adhesive 4 is used to perform securing in a short period of time, and the thermosetting resin 5 is used at the final securing portion 41 to improve securing strength. During the manufacture, since the preliminary securing precedes the final securing and the case 21 can be moved even after the preliminary securing, the thermosetting resin 5 for the final securing is set by a batch process after being applied. Thus, the case 21 is removed from the fiber inserting apparatus in a short period of time to improve the operating efficiency of the fiber inserting apparatus, and the batch process improves the operability during the setting of the thermosetting resin.

The optical fiber cable 25 and optical fiber 3 are secured to various parts using an ultraviolet-setting adhesive, thermosetting resin and the like. For example, the optical cable 25 is secured to the guide portion 21b with thermosetting resin 45. When the optical fiber 3 is secured to the base plate 30 or the like by means of soldering, techniques are employed including provision of a metalized layer on the surface of the optical fiber 3.

The case 21 is filled with silicone gel 6 which is transparent to light transmitted through the optical fiber 3 and which serves as a protective body (protective film) resistant to humidity. The silicone gel 6 covers the base plate 30, silicon platform 1, optical fiber 3, semiconductor laser chip 7, light-receiving element 31 and the like to improve humidity resistance. The cap 22 is secured to the case 21 using an adhesive. The adhesive is the thermosetting resin 45 for securing the optical fiber cable 25 to the guide portions 21b and 22b. The protective film 6 is not limited to silicone gel, and silicone rubber, low-stress epoxy resin, acrylic resin or urethane resin may be used.

A method of manufacturing a semiconductor optical module 20 will now be described.

First, there is provided a plastic case 21 having a guide for guiding an optical fiber 3, a plastic cap 22 mounted so as to close the case 21, and a silicon platform 1 having a semiconductor laser chip 7 and a light-receiving element 31 mounted on one surface thereof and having a groove 2 for guiding the optical fiber 3 extending toward the semiconductor laser chip 7. The case 21 and cap 22 have structures as described above.

A metalized layer having a predetermined pattern is formed on one surface of the silicon platform 1, and a part of the same constitute mounting portions 32 and 33. The semiconductor laser chip 7 and light-receiving element 31 are secured to the mounting portions 32 and 33. Both of the semiconductor laser chip 7 and light-receiving element 31 have electrodes on upper and lower surfaces, and the bonding structure therefore electrically connects the electrodes on the lower surface to the mounting portions 32 and 33, respectively. A part of the mounting portions 32 and 33 constitutes pads connected to ends of wires which are connected to inner ends of leads to be described later at other ends thereof. The electrodes on the upper surfaces of the semiconductor laser chip 7 and light-receiving element 31 are secured to respective independent metalized layers through conductive wires 34. The independent metalized layers also have pads connected to ends of wires which are connected to inner ends of leads to be described later at other ends thereof.

A discharge groove 35 is provided such that it crosses the groove 2 provided on one surface of the silicon platform 1. The discharge groove 35 has the function of guiding an adhesive that flows into it when the optical fiber 3 is secured, to the outside, to prevent the adhesive from flowing toward the semiconductor laser chip 7.

Next, the silicon platform 1 is secured to a base plate 30 in the case 21 using a bonding material 29, e.g., silver paste.

Then, the pad portions of the metalized layer and inner ends of leads 27 are connected with conductive wires 34 (see FIGS. 5 and 6).

Next, an optical fiber cable 25 from which an optical fiber 3 is exposed by removing a part of a jacket thereof a predetermined distance from the end thereof is inserted into a guide portion 21b ; the semiconductor laser chip 7 is operated to emit laser light which is taken into the optical fiber 3 from the end of the optical fiber 3; optical coupling is adjusted while detecting optical output; and thermosetting resin (e.g., epoxy resin) is applied to the guide portion 21b to bond them together after the adjustment of optical coupling is completed. The adjustment of optical coupling is may be well-known passive alignment which involves no emission of laser light.

Next, an ultraviolet-setting adhesive is applied to a part of the groove 2 to perform preliminary securing of the optical fiber 3. Specifically, as shown in FIGS. 9A and 10, an ultraviolet-setting adhesive 4 is applied to the groove 2 of the silicon platform 1, and the optical fiber 3 is thereafter pressed against the ultraviolet-setting adhesive 4, which consequently presses it against the bottom of the groove 2.

As shown in FIG. 9B, such a press is achieved by applying a predetermined load to a pressing piece 50. For example, a load of 100 g is applied. The semiconductor laser chip 7 is operated to emit laser light which is taken into the optical fiber 3 at the end thereof, and optical coupling is adjusted while detecting optical output.

At this point, as shown in FIG. 9B, the adjustment of optical coupling is conducted in a state in which one end of the optical fiber 3 is fitted in the groove 2 on the silicon platform 1 and the groove 2 under the optical fiber is filled with the ultraviolet-setting adhesive 4.

Next, the ultraviolet-setting adhesive 4 on both sides of the optical fiber 3 is irradiated with ultraviolet light using an ultraviolet light radiation fibers 51 and 52 to set the ultraviolet-setting adhesive 4. The ultraviolet-setting adhesive 4 thus set forms a preliminary securing portion 40 and, as shown in FIG. 11, the optical fiber 3 becomes static and is secured to the silicon platform 1. Then, an ultraviolet-setting adhesive 26 is used to secure the region where the guide portion 21b and optical fiber 3 contact each other and the region of the optical fiber cable 25 that protrudes from the guide portion 21b.

Next, as shown in FIG. 9C, thermosetting resin 5 is applied such that it extends from above the optical fiber 3 down to a surface of the silicon platform 1 and is subjected to a thermosetting process to form a final securing portion 41 constituted by the thermosetting resin 5 (see FIGS. 7 and 8). The final securing portion 41 has a structure to cover the preliminary securing portion 40 completely, thereby rigidly securing the optical fiber 3 on the silicon platform 1.

As shown in FIGS. 7 and 8, the optical fiber 3 is thus secured on the silicon platform 1 with the two types of adhesives at the preliminary securing portion 40 and final securing portion 41 in the vicinity of the discharge groove 35. The preliminary securing portion 40 is constituted by the ultraviolet-setting adhesive 4, and the final securing portion 41 is constituted by the thermosetting resin 5. FIGS. 4 through 6 show only the final securing portion 41.

Next, as shown in FIG. 12, the case 21 is filled with silicone gel 6 to cover the silicon platform 1, optical fiber 3, semiconductor laser chip (not shown) and light-receiving element (not shown). This is carried out in order to improve humidity resistance. In doing so, in the region secured using the ultraviolet-setting adhesive 4, the silicone gel 6 does not enter the region of the groove 2 under the optical fiber 3 because this region is filled with the ultraviolet-setting adhesive 4.

The cap 22 is then bonded to the case 21 using an adhesive and is secured to the case 21 by baking the adhesive. The case 21 and cap 22 are secured together by filling the guide portions 21b and 22b the case 21 and of the cap 22 with thermosetting resin 45 and by setting the thermosetting resin 45.

The optical fiber 3 may be secured to a predetermined location using other bonding materials, although not described in detail.

During the thermal process for securing the cap 22 to the case 21, no bubble is generated in the silicone gel 6 because the silicone gel 6 is not present under the optical fiber 3 in the region secured using the ultraviolet-setting adhesive 4.

When the optical fiber 3 is fitted in the groove 2 on the silicon platform 1, a space is defined by the groove 2 under the optical fiber 3, and this space is filled with the ultraviolet-setting adhesive 4 in the present embodiment. Therefore, the silicone gel 6 does not enter the region under the optical fiber 3 associated with the preliminary securing portion when the case is filled with the silicone gel 6 before sealing with the cap and, therefore, no bubble is caused by the setting and contraction of the silicone gel 6. This makes it possible to prevent any reduction in the strength and reliability of the securing of the optical fiber 3 attributable to bubbles and to prevent problems such as freezing of moisture trapped by bubbles.

Specifically, even if moisture enters along the optical fiber 3, since the gap between the optical fiber 3 and groove 2 at the preliminary securing portion is filled with the ultraviolet-setting adhesive 4 for preliminary securing, the invasion of moisture is prevented at the preliminary securing portion, and there is no nucleus like a bubble in the silicone gel that can trap moisture. This prevents trapping of moisture to improve humidity resistance and eliminates the possibility of freezing moisture during use at a low temperature.

In a structure in which the optical fiber 3 is secured on the support substrate 1 using only a first bonding element constituted by an ultraviolet-setting adhesive or thermosetting resin, since the groove 2 under the optical fiber 3 is filled with the first bonding element 1, the silicone gel does not enter the groove region under the optical fiber, and this also prevents the generation of bubbles attributable to the setting and contraction of the silicone gel.

Further, only a small amount of silicone gel 6 enters the groove 2 under the end portion because the end portion of the optical fiber 3 protruding from the region secured using the first bonding element is as short as several hundred µm, and a region open to the atmosphere (open space) exists ahead the end of the optical fiber 3. The silicone gel 6 moves when it sets and contracts, which suppresses the generation of bubbles. This not only prevents the generation of bubbles in the silicone gel at the end of the optical fiber 3 and under the same to eliminate nuclei to trap moisture but also eliminates bubbles from the gap between the semiconductor laser chip 7 and optical fiber 3. This prevents eclipse of laser light attributable to bubbles to allow optical coupling of the optical fiber with high efficiency.

According to the present manufacturing method, even if bubbles are generated in the silicone gel in the groove under the optical fiber, such bubbles have small diameters. For example, there will be no bubble that is equal to or greater than one half of the distance between the two points of the groove in contact with the circumferential surface of the optical fiber (the distance is represented by "x" in FIG. 1 where x is about 102 µm), and bubbles will be smaller than the half of the distance between the two points and will be unlikely to serve as nuclei to trap moisture. Specifically, the inventor has found that even if the silicon gel enters any cavity formed in the region of the ultraviolet-setting adhesive 4 in the groove under the optical fiber, any bubble generated in the silicon gel has a diameter $\phi$ equal to or smaller than x when the silicon gel has a diameter $\phi$ equal to or smaller than x ($\phi<x/2$) and is unlikely to act as a nucleus to trap moisture. That is, no nucleus to trap moisture is generated in the region of the ultraviolet-setting adhesive 4 in the groove under the optical fiber where neither bubbles nor silicon gel having a diameter greater than one half of x exists in that region.

The first embodiment provides the following effects.

(1) The package 23 is formed by the case 21 and cap 22 made of plastic, the case 21 is filled with the silicone gel 6 to cover and protect the semiconductor laser chip 7, optical fiber 3, light-receiving element 31, silicon platform 1 and the like. This makes it possible to improve humidity resistance.

(2) After the adjustment of optical coupling, the optical fiber 3 is preliminary secured to the region of the groove 2 on the silicon platform 1 with the ultraviolet-setting adhesive 4 and is thereafter subjected to final securing with the thermosetting resin 5, which improves the reliability of optical coupling.

(3) Since the thermosetting resin 5 has high bonding strength, the optical fiber 3 is reliably secured to the silicon platform 1 through the final securing using the thermosetting resin 5, and the optical fiber 3 is thus secured with improved reliability. At the preliminary securing portion 40, the optical fiber is secured so that the optical coupling between the optical fiber 3 and the semiconductor laser chip 7 is not deteriorated, and at the final securing portion 41, the strength of the securing of the optical fiber 3 is improved.

(4) Since preliminary and final securing is carried out as in (2) and (3) above, the optical fiber 3 is secured on the silicon platform with high optical coupling and high reliability of coupling.

(5) When the optical fiber 3 is secured in the groove 2 on the silicon platform 1, the optical fiber 3 is pressed against the silicon platform 1 after optical coupling between the semiconductor laser chip 7 and optical fiber 3 is adjusted, and the optical fiber 3 is preliminary secured in such a state by applying the ultraviolet-setting adhesive 4 and irradiating the ultraviolet-setting adhesive 4 with ultraviolet light to set it. This makes it possible to reduce the time required for the preliminary securing to several tens seconds.

(6) Since the preliminary securing using the ultraviolet-setting adhesive 4 provides high securing reliability in a short term, the optical coupling between the optical fiber 3 and semiconductor laser chip 7 is not deteriorated during the time interval before the subsequent final securing. Therefore, when the optical fiber 3 is finally secured with the thermosetting resin 5 thereafter, the thermosetting process following the application of the thermosetting resin 5 can be carried out on a batch process basis. This makes it possible to improve the efficiency of the operation of securing the optical fiber, thereby achieving a reduction in the manufacturing cost of the semiconductor optical module (photoelectronic device) 20.

(7) The preliminary securing using the ultraviolet-setting adhesive 4 is carried out on a fiber inserting apparatus for aligning the optical axes of the semiconductor laser chip 7 and optical fiber 3. Since the time for the preliminary securing of the optical fiber 3 is reduced to several tens seconds, the operating efficiency of the fiber inserting apparatus can be improved.

(8) Since a fiber inserting apparatus is expensive, improved operating efficiency of a fiber inserting apparatus results in a reduction of the manufacturing cost of the semiconductor optical module 20.

A second embodiment of the invention will now be described.

FIGS. 13 through 15 illustrate a semiconductor optical module which is another embodiment (second embodiment) of the invention. FIG. 13 is a schematic plan view of the region of the silicon platform. FIG. 14 is a schematic sectional view of the region of the silicon platform. FIG. 15 is a schematic perspective view of an optical fiber secured on the silicon platform.

The second embodiment is different from the first embodiment in that securing is performed such that the final securing portion 41 covers a part of the preliminary securing portion 40 and such that the final securing portion 41 is located at the side of the preliminary securing portion 40 which is farther from the semiconductor laser chip 7 (photoelectric conversion element).

In such a structure wherein securing is performed such that the final securing portion 41 covers a part of the preliminary securing portion 40 and such that the final securing portion 41 is located at the side of the preliminary securing portion 40 which is farther from the semiconductor laser chip 7, even if the thermosetting resin 5 for the final securing operation undesirably flows during the application of the same, it does not flow toward the semiconductor laser chip 7 beyond the edge of the ultraviolet-setting adhesive 4 forming the preliminary securing portion 40. Thus, the light path will not be blocked, and the thermosetting resin 5 will not reduce light transmitted and received between the optical fiber 3 and semiconductor laser chip 7.

The second embodiment provides the same effects as those of the first embodiment.

A third embodiment of the invention will now be described.

FIG. 16 is a schematic enlarged sectional view of the region of the silicon platform of a photoelectronic device which is another embodiment (third embodiment) of the invention, showing a region where the semiconductor laser chip 7 and optical fiber 3 are optically coupled.

In the present embodiment, a bubble generation preventing portion 60 is provided in the form of a recess or groove extending across the groove 2 in a region between one end of the optical fiber 3 secured with a first bonding element (ultraviolet-setting adhesive 4) and the photoelectric conversion element (semiconductor laser chip) 7. The bubble generation preventing portion 60 has a length as large as 50 µm or more in the direction of the groove 2 (the extending direction of the optical fiber 3) and defines an open region.

The utmost end of one end of the optical fiber 3 is located above the bubble generation preventing portion 60.

The utmost end face of an end of the insulated optical fiber 3 is close to an edge of the bubble generation preventing portion 60. For example, the end face of the optical fiber 3 is located above the bubble generation preventing portion 60 and protrudes from the edge of the bubble generation preventing portion 60 a distance of several hundred µm or less.

Such a photoelectronic device is assembled using a method as described below. There is provided the support substrate (silicon platform 1) having the semiconductor laser chip 7 mounted on one surface thereof, the groove 2 for guiding the optical fiber 3 extending toward the semiconductor laser chip 7, and the bubble generation preventing portion 60 constituted by a recess or groove extending across the groove 2, provided in a region close to an end of the optical fiber 3 on a side of a securing portion utilizing a bonding element (first bonding element) of the optical fiber 3.

Next, optical coupling between the optical fiber 3 and semiconductor laser chip 7 is adjusted, and the optical fiber 3 is preliminary secured to the groove 2 excluding the region of the bubble generation preventing portion 60 using the ultraviolet-setting adhesive 4.

The bubble generation preventing portion 60 is formed in advance in a position such that the end face of the optical fiber 3 slightly protrudes above the bubble generation preventing portion 60 when optical coupling has been achieved.

According to the third embodiment of the invention, (1) since the bubble generation preventing portion 60 in the form of a recess or groove extending across the groove 2 is provided between the region of the optical fiber 3 secured with the first bonding element (ultraviolet-setting adhesive 4) at an end thereof and the semiconductor laser chip 7, the bubble generation preventing portion 60 which is an open region exists in the region of the groove 2 directly under the optical fiber 3 on both sides of the optical fiber 3. This results in movement of silicone gel 6 in the groove 2 when it sets and contracts and thereby prevents the generation of bubbles.

(2) Since the utmost end of one end of the optical fiber 3 is located above the bubble generation preventing portion 60 and its utmost end face is as close as several hundred µm to an edge of the bubble generation preventing portion 60, no bubble is generated directly under the optical fiber 3 and at the end of the optical fiber. That is, the bubble generation preventing portion 60 serves as an open region that allows movement of the silicone gel 6 when the silicone gel 6 sets and contacts, to prevent the generation of bubbles.

The present embodiment may have a configuration in which the end face of the optical fiber 3 is aligned with the edge of the bubble generation preventing portion 60. In this case, no bubble will be generated because the ultraviolet-setting adhesive 4 is present directly under the optical fiber 3.

According to the present embodiment, the effect of suppressing bubbles can be achieved with a structure in which the optical fiber 3 is secured on the silicon platform 1 with thermosetting resin filled in the groove 2, i.e., a securing structure utilizing one type of adhesive.

A fourth embodiment of the invention will now be described.

FIG. 17 is a schematic enlarged sectional view of the region of a silicon platform of a photoelectronic device which is another embodiment (fourth embodiment) of the invention. FIG. 18 is a schematic enlarged plan view of the region of the silicon platform.

According to the present embodiment, one end of the optical fiber 3 extends beyond the bubble generation preventing portion 60 and its utmost end is supported by the groove 2.

According to the present embodiment, since one end of the optical fiber 3 extends beyond the bubble generation preventing portion 60 and its utmost end is supported (guided) by the groove 2, the optical coupling factor between the optical fiber 3 and semiconductor laser chip 7 is improved.

Although silicone gel 6 enters a region under the optical fiber 3, the generation of bubbles is unlikely to occur in the region because it has the bubble generation preventing portion 60 to serve as an open region. This makes it possible to suppress trapping of moisture and to prevent eclipse of laser light 11 attributable to bubbles.

Since the bubble generation preventing portion 60 is a recess and is not a groove whose ends are open at ends of silicon platform 1, the silicone gel will not flow out. As a result, the silicon gel is likely to move into the region directly under the optical fiber 3 when the silicone gel sets and contracts, and this makes it possible to prevent the generation of bubbles. However, the bubble generation preventing portion 60 may be a groove as long as it has a great width to contain the silicone gel in an amount sufficient to prevent the generation of bubbles.

According to the present embodiment, the effect of suppressing bubbles can be achieved with a structure in which the optical fiber 3 is secured on the silicon platform 1 with thermosetting resin filled in the groove 2, i.e., a securing structure utilizing one type of adhesive.

A fifth embodiment of the invention will now be described.

FIG. 19 is a schematic enlarged sectional view of the region of a silicon platform of a photoelectronic device which is another embodiment (fifth embodiment) of the invention.

The present embodiment is an example in which the bubble generation preventing portion 60 is provided in a wide range covering the securing portion utilizing the ultraviolet-setting adhesive 4 and the region where the semiconductor laser chip 7 is mounted. It employs a structure in which the end of the optical fiber 3 is located above the bubble generation preventing portion 60.

According to the present embodiment, since the utmost end of one end of the optical fiber 3 is located above the bubble generation preventing portion 60, the bubble generation preventing portion 60 as an open region exists in the region the groove 2 directly under the optical fiber 3 on both sides of the optical fiber 3. This causes the silicone gel to move when it sets and contracts, thereby preventing the generation of bubbles.

A sixth embodiment of the invention will now be described.

FIGS. 20 through 22 illustrate a photoelectronic device which is another embodiment (sixth embodiment) of the invention. FIG. 20 is a partially cut away plan view of the photoelectronic device. FIG. 21 is a sectional view of the photoelectronic device. FIG. 22 is a plan view of a part of a lead frame showing the state of the photoelectronic device at one step of manufacturing the same.

In the present embodiment, a package 61 made of insulating resin such as epoxy resin formed by means of resin molding covers the support substrate (silicon platform) 1, semiconductor laser chip 7, the ends of the leads 27, wires 34, one end of the optical fiber 3 and the like.

The optical fiber 3 is coated with a jacket 62 which is generally made of nylon or the like to form an optical cable 66. In the present embodiment, the jacket 62 is peeled off at one end of the optical cable 66 to expose the optical fiber 3 (optical fiber core). The exposed optical fiber 3 and the end of the jacket 62 are positioned and sealed in the package 62. The end of the jacket 62 is secured to a support portion 63 which is a downward step provided on the silicon platform 1 with an adhesive 64.

The package 61 has a structure including a narrow optical fiber guide for guiding the region of the jacket 62. The package 61 is formed by means of transfer molding, although this is not limiting the invention.

The silicon platform 1 used in the present embodiment is also in accordance with the above embodiments in the region of the optical connection between the semiconductor laser chip 7 and optical fiber 3. Specifically, a silicon platform 1 having the structure according to the fourth embodiment shown in FIG. 17 is used here.

As shown in FIGS. 20 and 21, in order to improve the reliability (humidity resistance) of the photoelectronic device, silicon gel 6 covers regions including the component mounting surface of the silicon platform 1, wires 34, the inner ends of the leads 27, and the inner end of the jacket 62.

The silicon platform 1 is secured on a flat support portion (tab) 70 provided between the ends of some of the leads 27. The package 61 has a structure in which the rear side of the tab 70 is also sealed.

Such a photoelectronic device is manufactured using a method as described below.

Specifically, it is a method of manufacturing a photoelectronic device comprising:

a package 61 made of insulating resin;

a support portion 70 located in the package 61;

a support substrate (silicon platform) 1 secured to the support portion 70 having a photoelectric conversion element mounted on one surface thereof and having a groove 2 for guiding an optical fiber 3 extending toward the photoelectric conversion element (semiconductor laser chip 7);

a photoelectric conversion element mounted on the support substrate1; and an optical fiber 3 fitted in the groove 2 on the support substrate 1 to be guided thereby with one end thereof in a face-to-face relationship with the photoelectric conversion element and the other end thereof located outside the package and protected by a jacket 62, wherein one end of the optical fiber 3 extending in the package is fitted in the groove 2 on the support substrate 1 and is secured on the support substrate 1 through preliminary securing with an ultraviolet-setting adhesive and final securing with thermosetting resin, the method comprising the steps of:

providing the support substrate 1 on which a lead frame 71 having the support portion 70 thereon and the photoelectric conversion element are secured;

securing the support substrate 1 to the support portion 70 on the lead frame 71;

applying the ultraviolet-setting adhesive to a part of the groove 2 on the support substrate 1, fitting one end of the optical fiber 3 guided under the protection of the jacket 62 in the groove 2 on the support substrate 1 and adjusting optical coupling between the photoelectric conversion element and optical fiber 3 with the groove 2 under the optical fiber 3 filled with the ultraviolet-setting adhesive;

preliminary securing the optical fiber 3 on the support substrate 1 by irradiating the ultraviolet-setting adhesive with ultraviolet light to set it;

covering a part of the optical fiber 3 and support substrate 1 with the thermosetting resin and setting the thermosetting resin to finally secure the optical fiber 3 on the support substrate 1;

connecting wiring on the support substrate 1 and leads 27 on the lead frame with conductive wires 34 before or after securing the optical fiber 3 on the support substrate 1;

covering a region including the photoelectric conversion element, one end of the optical fiber 3, the wires 34 and the region of the leads connected to the wires with a protective element (silicone gel 6) transparent to light transmitted by the optical fiber 3;

molding a region including the jacket 62 halfway with insulating resin to form the package 61;

cutting and removing an unnecessary part of the lead frame protruding from the package 61; and shaping the leads 27 protruding from the package 61 into a predetermined configuration.

The photoelectronic device according to the sixth embodiment is manufactured using a lead frame 71 as shown in FIG. 21. The lead frame 71 is in the form of a strip, and a plurality of photoelectronic devices can be manufactured from one lead frame 71. Specifically lead patterns 72 for manufacturing photoelectronic devices are provided at constant intervals in the longitudinal direction of a lead frame 71. FIG. 22 shows a single lead pattern 72.

FIG. 22 shows the formation of a package 61 by means of transfer molding.

There are many possible operational procedures for manufacturing the photoelectronic device, for example, the semiconductor laser chip 7, light-receiving element 31 and the like are secured on the silicon platform 1 with the groove 2, bubble generation preventing portion 60, support portion (not shown) and the like provided thereon, and the optical fiber 3 is thereafter secured on the silicon platform 1 using the techniques described in the above-described embodiments.

The silicon platform 1 is then secured on the tab 70 of the lead frame 71.

Next, the silicone gel 6 is applied to a rectangular region including the inner ends of the leads 27 and is thereafter subjected to a thermal process at a predetermined temperature to be set. In the present embodiment, when the silicon gel 6 sets, no bubble is generated not only in the vicinity of the optical fiber 3 but also in other regions of the silicone gel 6 as described above.

Next, the lead frame 71 is clamped by a molding die (not shown) of a transfer molding apparatus and is molded to form the package 61. FIG. 22 shows a subrunner 77 and a gate portion 78 through which melted resin flows.

After the molding, an unnecessary part of the lead frame is cut and removed although not shown, and the leads 27 protruding from the package 61 are shaped. They are shaped into a dual inline configuration in the present embodiment.

The present embodiment makes it possible to achieve high productivity and to reduce the manufacturing cost of a photoelectronic device because the package 61 is formed by molding insulating resin.

A seventh embodiment of the invention will now be described.

FIG. 23 is a partially cut-away plan view of a photoelectronic device which is another embodiment (seventh embodiment) of the invention. FIG. 24 is a sectional view of the photoelectronic device.

The present embodiment has a structure in which an optical fiber 3 (optical fiber core) supported by a ferrule 81 with a sleeve 80 is secured on the silicon platform 1. One end of the sleeve 80 protrudes from the package 60, and an optical connector is attached thereto.

The optical connector is secured to one end of the optical fiber. In the present embodiment, the package 61 is provided with a pair of latches 82 which elastically operate to lock the optical connector fitted to the sleeve 80.

The present embodiment also makes it possible to achieve high productivity and to reduce the manufacturing cost of a photoelectonic device because the package 61 is formed by molding insulating resin. Further, the optical connector can be simply attached by a single action.

While the present invention has been specifically described with reference to embodiments of the same, the invention is not limited to the above-described embodiments and may obviously modified in various ways without departing from the principle behind the same. For example, a case and a cap made of materials other than plastic may be similarly used with the same effects as those of the above embodiments as long as a structure is employed in which the case is filled with silicone gel.

While the embodiments have referred to structures for optical coupling between an optical fiber fitted in a groove and a semiconductor laser chip, the invention can be equally applied to structures for optical coupling between an optical fiber fitted in a groove and another photoelectric conversion element such as a light-receiving element (photodiode) or light-emitting diode with the same effects as those of the above-described embodiments.

The invention can be equally applied at least to structures in which an optical fiber is secured in a groove such as a V-shaped groove with an adhesive and in which the optical fiber and the like is covered with a substance such as silicone gel that generates bubbles therein when it thermally sets and contracts.

Typical aspects of the invention disclosed in the above embodiments can be briefly described as follows.

(1) There is provided a photoelectronic device comprising a support substrate (silicon platform) constituted by a mounting portion for mounting a photoelectric conversion element (semiconductor laser chip) on one surface thereof and a silicon substrate having a groove for guiding an optical fiber extending toward the mounting portion, a photoelectric conversion element secured on the mounting portion and an optical fiber fitted in the groove at one end thereof and secured on the support substrate at regions excluding the utmost end thereof, wherein the optical fiber fitted in the groove is secured with a first bonding element injected to fill the groove under the optical fiber for preliminary securing the optical fiber on the support substrate and a second bonding element for finally securing the optical fiber on the support substrate while covering a part of the optical fiber and support substrate and wherein a protective element transparent to light transmitted by the optical fiber covers a region including the photoelectric conversion element on one surface of the support substrate and one end of the optical fiber. The second bonding element covers all or a part of the region where the first bonding element exists. The first bonding element is constituted by an ultraviolet-setting adhesive, and the second bonding element is constituted by thermosetting resin. The support substrate is secured in a case made of plastic having a guide for guiding the optical fiber. The case is filled with the protective element to cover the support substrate, photoelectric conversion element, optical fiber and the like. The case is closed with a cap made of plastic and is secured on the support substrate with an adhesive. The protective element is constituted by any of silicone gel, silicone rubber, low-stress epoxy resin, acrylic resin and urethane resin. For example, it is constituted by silicone gel. With this configuration, bubbles in sizes equal to or greater than one half of the distance between the two points of the groove in contact with the circumferential surface of the optical fiber are not present in the region defined by the optical fiber and groove and the region between one end face of the optical fiber and the semiconductor laser chip.

This configuration is characterized by the preliminary securing and final securing referred to as "first securing" and "second securing", respectively. In a certain limited aspect, it may be stated that the optical fiber is secured on the support substrate using first and second securing techniques (means) having different securing speeds and that the securing speed of the first securing means is higher than that of the second securing means.

Such a photoelectronic device is manufactured according to the following method.

The method comprises the steps of:
providing a support substrate having a photoelectric conversion element mounted thereon and having a groove for guiding an optical fiber extending toward the photoelectric conversion element;
applying an ultraviolet-setting adhesive to a part of the groove on the support substrate, fitting one end of the optical fiber in the groove on the support substrate and adjusting optical coupling between the photoelectric conversion element and optical fiber with the groove under the optical fiber filled with the ultraviolet-setting adhesive;
preliminary securing the optical fiber on the support substrate by irradiating the ultraviolet-setting adhesive with ultraviolet light to set it; and
covering a part of the optical fiber and support substrate with thermosetting resin and setting the thermosetting resin to finally secure the optical fiber on the support substrate.

Specifically, it is a method of manufacturing a photoelectronic device comprising:
a package constituted by a case made of plastic having a guide for guiding an optical fiber and a cap made of plastic for closing the case, attached to the case with an adhesive;
a support substrate secured in the case having a photoelectric conversion element mounted on one surface thereof and having a groove for guiding an optical fiber extending toward the photoelectric conversion element and an optical fiber guided by the guide into and out of the package, wherein one end of the optical fiber extending in the package is fitted in the groove on the support substrate and is secured on the support substrate through preliminary securing with an ultraviolet-setting adhesive and final securing with thermosetting resin. The method comprises the steps of:
applying the ultraviolet-setting adhesive to a part of the groove on the support substrate, fitting one end of the optical fiber in the groove on the support substrate and adjusting optical coupling between the photoelectric conversion element and optical fiber with the groove under the optical fiber filled with the ultraviolet-setting adhesive;
preliminary securing the optical fiber on the support substrate by irradiating the ultraviolet-setting adhesive with ultraviolet light to set it;
covering a part of the optical fiber and support substrate with thermosetting resin and setting the thermosetting resin to finally secure the optical fiber on the support substrate; and
filling the case with a protective element transparent to light transmitted by the optical fiber before mounting the case, and setting the same. The protective element is constituted by any of silicone gel, silicone rubber, low-stress epoxy resin, acrylic resin or urethane resin. For example, silicone gel is used. Securing is carried out by determining positions for the preliminary securing and/or final securing such that all or a part of the preliminary securing portion is covered by the final securing portion. The process of setting the thermosetting resin at the final securing is performed as a batch process.

A structure may be employed in which an optical fiber is secured on a support substrate with only a first bonding element. Specifically, there may be provided a photoelectronic device comprising a support substrate constituted by a mounting portion for mounting a photoelectric conversion element on one surface thereof and a silicon substrate having a groove for guiding an optical fiber extending toward the mounting portion, a photoelectric conversion element secured on the mounting portion and an optical fiber fitted in the groove at one end thereof and secured on the support substrate at regions excluding the utmost end thereof, the device having a structure wherein the optical fiber fitted in the groove is secured with a first bonding element injected to fill the groove under the optical fiber for securing the optical fiber on the support substrate and wherein a protective element transparent to light transmitted by the optical fiber covers a region including the photoelectric conversion element on one surface of the support substrate and one end of the optical fiber. In this case, the first bonding element is constituted by an ultraviolet-setting adhesive or thermosetting resin.

(2) In the configuration described in the aspect (1), the support substrate, photoelectric conversion element and one end of the optical fiber are covered by a package constituted by insulating resin formed by molding resin, and the protective element is provided in the package to block the path of moisture that enters the photoelectric conversion element from the outside of the package.

Such a photoelectronic device is manufactured using the following method.

It is a method for manufacturing a photoelectronic device comprising:
a package made of insulating resin;
a support portion located in the package;
a support substrate secured to the support portion having a photoelectric conversion element mounted on one surface thereof and having a groove for guiding an optical fiber extending toward the photoelectric conversion element;
a photoelectric conversion element mounted on the support substrate; and
an optical fiber fitted in the groove on the support substrate and guided by a guide or a ferrule having a sleeve with one end thereof in a face-to-face relationship with the photoelectric conversion element and the other end thereof located outside the package and protected by a jacket, wherein one end of the optical fiber extending in the package is fitted in the groove on the support substrate and is secured on the support substrate through preliminary securing with an ultraviolet-setting adhesive and final securing with thermosetting resin, the method comprising the steps of:
providing the support substrate on which a lead frame having the support portion thereon and the photoelectric conversion element are secured;
securing the support substrate to the support portion on the lead frame;
applying the ultraviolet-setting adhesive to a part of the groove on the support substrate, fitting one end of the optical fiber protected by the jacket and guided by a guide or a ferrule having a sleeve in the groove on the support substrate and adjusting optical coupling between the photoelectric conversion element and optical fiber with the groove under the optical fiber filled with the ultraviolet-setting adhesive;
preliminary securing the optical fiber on the support substrate by irradiating the ultraviolet-setting adhesive with ultraviolet light to set it;

covering a part of the optical fiber and support substrate with the thermosetting resin and setting the thermosetting resin to finally secure the optical fiber on the support substrate;

connecting wiring on the support substrate and leads on the lead frame with conductive wires before or after securing the optical fiber on the support substrate;

covering a region including the photoelectric conversion element, one end of the optical fiber, the wires and the region of the leads connected to the wires with a protective element transparent to light transmitted by the optical fiber;

molding a region including the jacket or the sleeve halfway with insulating resin to form the package; and cutting and removing an unnecessary part of the lead frame protruding from the package.

(3) In the configuration according to the aspect (1) or (2), securing is performed such that a part of the preliminary securing portion is covered by the final securing portion and such that the final securing portion is located at the side of the preliminary securing portion farther from the photoelectric conversion element.

(4) In the configuration according to any of the aspects (1) through (3), a bubble generation preventing portion is provided in the form of a recess or groove extending across the groove in a region between one end of the optical fiber secured with the first bonding element and the photoelectric conversion element. The length of the bubble generation preventing portion is 50 $\mu$m or more in the direction of the groove.

The following method is used for such a photoelectronic device. There is provided a support substrate having a photoelectric conversion element mounted on one surface thereof, a groove for guiding an optical fiber extending toward the photoelectric conversion element, and a bubble generation preventing portion constituted by a recess or groove extending across the groove, provided in a region close to an end of the optical fiber on a side of a securing portion utilizing a bonding element. Thereafter, optical coupling between the optical fiber and photoelectric conversion element is adjusted, and the optical fiber is preliminary secured to the groove excluding the region of the bubble generation preventing portion using an ultraviolet-setting adhesive.

(5) In the configuration according to the aspect (4), the utmost end of one end of the optical fiber is located above the bubble generation preventing portion.

(6) In the configuration according to the aspect (5), the utmost end face of one end of the optical fiber is as close as several hundred $\mu$m to an edge of the bubble generation preventing portion.

(7) In the configuration according to the aspect (4), one end of the optical fiber extends beyond the bubble generation preventing portion and its utmost end is supported by the groove.

According to the aspect (1), (a) while the package is formed by a case and a cap made of plastic, humidity resistance can be improved because the case is filled with silicone gel.

(b) When the optical fiber is fitted in the groove on the silicon platform (support substrate), a space is defined by the groove under the optical fiber. This space is filled with the ultraviolet-setting adhesive in the present embodiment. Therefore, the silicone gel does not enter the region under the optical fiber associated with the preliminary securing portion when the case is filled with the silicone gel before sealing with the cap, and no bubble is caused by the setting and contraction of the silicone gel. This makes it possible to prevent any reduction in the strength and reliability of the securing of the optical fiber 3 attributable to bubbles and to prevent problems such as freezing of moisture trapped by bubbles.

Specifically, even if moisture enters from the outside along the optical fiber, since the gap between the optical fiber and groove at the preliminary securing portion is filled with the ultraviolet-setting adhesive for preliminary securing, the invasion of moisture is prevented at the preliminary securing portion, and there is no nucleus like a bubble in the silicone gel that can trap moisture. This prevents trapping of moisture to improve humidity resistance and eliminates the possibility of freezing of moisture during use at a low temperature.

In the structure in which the optical fiber is secured on the support substrate using only a first bonding element constituted by an ultraviolet-setting adhesive or thermosetting resin, since the groove under the optical fiber is filled with the first bonding element, the silicone gel does not enter the groove region under the optical fiber, and this also prevents the generation of bubbles attributable to the setting and contraction of the silicone gel.

Further, only a small amount of silicone gel enters the groove under the end portion of the optical fiber because the end portion protruding from the region secured using the first bonding element is as short as several hundred im, and a region open to the atmosphere exists ahead the end of the optical fiber. Thus, the silicone gel moves when it sets and contracts, which suppresses the generation of bubbles. This not only prevents the generation of bubbles in the silicone gel at the end of the optical fiber and under the same to eliminate nuclei to trap moisture but also eliminates bubbles from the gap between the semiconductor laser chip and optical fiber. This prevents eclipse of laser light attributable to bubbles to allow optical coupling of the optical fiber with high efficiency.

Even if bubbles are generated in the silicone gel in the groove under the optical fiber, such bubbles have small diameters.

(c) After the adjustment of optical coupling, the optical fiber is preliminary secured to the region of the groove on the silicon platform with the ultraviolet-setting adhesive and is thereafter subjected to final securing with the thermosetting resin. This improves the reliability of optical coupling.

(d) Since the thermosetting resin has high bonding strength, the optical fiber is reliably secured to the silicon platform through the final securing using the thermosetting resin, and the optical fiber is thus secured with improved reliability. The optical fiber is secured at the preliminary securing portion such that the optical coupling between the optical fiber and the semiconductor laser chip is not deteriorated, and the final securing portion improves the securing strength of the optical fiber.

(e) Since preliminary and final securing is carried out as in (c) and (d) above, the optical fiber is secured on the silicon platform with high optical coupling and high reliability of coupling.

(f) When the optical fiber is secured in the groove on the silicon platform, the optical fiber is pressed against the silicon platform after optical coupling between the semiconductor laser chip and optical fiber is adjusted, and the optical fiber is preliminary secured in such a state by applying the ultraviolet-setting adhesive and irradiating the ultraviolet-setting adhesive with ultraviolet light to set it. This makes it possible to reduce the time required for the preliminary securing to several tens seconds.

(g) Since the preliminary securing using the ultraviolet-setting adhesive provides high securing reliability in a short term, the optical coupling between the optical fiber and semiconductor laser chip is not deteriorated during the time interval before the subsequent final securing. Therefore, when the optical fiber is finally secured with the thermosetting resin (epoxy resin) thereafter, the thermosetting process following the application of the thermosetting resin can be carried out on a batch process basis. This makes it possible to improve the efficiency of the operation of securing the optical fiber, thereby achieving a reduction in the manufacturing cost of the photoeelctronic device.

(h) The preliminary securing using the ultraviolet-setting adhesive is carried out on a fiber inserting apparatus for aligning the optical axes of the semiconductor laser chip and optical fiber. Since the time for the preliminary securing of the optical fiber is reduced (to several tens seconds), the operating efficiency of the fiber inserting apparatus can be improved.

(i) Since a fiber inserting apparatus is expensive, improved operating efficiency of a fiber inserting apparatus results in a reduction of the manufacturing cost of the photoelectronic device.

In the aspect (2) described above, there is the following effect in addition to the effects according to the aspect (1). In this aspect, it is possible to achieve high productivity and to reduce the manufacturing cost of a photoelectronic device because the package is formed by molding insulating resin.

In the aspect (3) described above, there is the following effect in addition to the effects according to the aspects (1) and (2). In this aspect, since securing is performed such that the final securing portion covers a part of the preliminary securing portion and such that the final securing portion is located at the side of the preliminary securing portion which is farther from the photoelectric conversion element, even if the thermosetting resin for the final securing operation undesirably flows during the application of the same, it does not flow toward the photoelectric conversion element beyond the edge of the ultraviolet-setting adhesive. Thus, the thermosetting resin will not reduce light transmitted and received between the optical fiber and photoelectric conversion element.

In the aspect (4) described above, since the bubble generation preventing portion in the form of a recess or groove extending across the groove is provided between the region of the optical fiber unsecured with the first bonding element at one end thereof and the photoelectric conversion element, the bubble generation preventing portion which is an open region exists in the region of the groove directly under the optical fiber on both sides of the optical fiber. This results in movement of silicone gel in the groove when it sets and contracts and thereby prevents the generation of bubbles.

In the aspect (5) described above, since the utmost end of one end of the optical fiber is located above the bubble generation preventing portion, the bubble generation preventing portion which is an open region exists in the region of the groove directly under the optical fiber on both sides of the optical fiber. This results in movement of silicone gel in the groove when it sets and contracts and thereby prevents the generation of bubbles.

In the aspect (6) described above, since the utmost end of one end of the optical fiber is located above the bubble generation preventing portion and is aligned with or as close as several hundred am to an edge of the bubble generation preventing portion, no bubble is generated directly under the optical fiber and at the end of the optical fiber.

In the aspect (7) described above, since one end of the optical fiber extends beyond the bubble generation preventing portion and its utmost end is supported by the groove, the optical coupling factor between the optical fiber and semiconductor laser chip is improved.

The effects achieved in typical aspects of the invention disclosed here can be briefly summarized as follows.

(1) Since the package is formed by a case and a cap which are both made of inexpensive plastic, the manufacturing cost of semiconductor optical module (photoelectronic device) can be reduced.

(2) Although the package is made of plastic, the case is filled with silicone gel to cover and protect the semiconductor laser chip, optical fiber, light-receiving element, silicon platform and the like. It is therefore possible to improve humidity resistance.

(3) Although a space is defined by the groove on the silicon platform under the optical fiber when the optical fiber is fitted in the groove, this space is filled by the ultraviolet-setting adhesive forming the preliminary securing portion. Therefore, silicone gel does not enter the region under the optical fiber associated with the preliminary securing portion when the case is filled with the silicone gel before sealing with the cap and, therefore, no bubble is generated in silicone gel. This makes it possible to prevent any reduction in the strength and reliability of the securing of the optical fiber attributable to bubbles and to prevent problems such as reduction of humidity resistance attributable to bubbles and freezing of moisture trapped by bubbles.

(4) After the adjustment of optical coupling, the optical fiber is preliminary secured to the region of the groove on the silicon platform with an ultraviolet-setting adhesive and is thereafter subjected to final securing with thermosetting resin, which improves the reliability of optical coupling.

(5) The optical fiber is secured using a fiber inserting apparatus while adjusting optical coupling. Once the preliminary securing with an ultraviolet-setting adhesive is completed, the silicon platform may thereafter be removed from the fiber inserting apparatus to allow the final securing with thermosetting resin to be carried out in a different location. This makes it possible to improve the operating efficiency of a fiber inserting apparatus.

(6) The baking process that follows the final securing with thermosetting resin can be carried out on a batch process basis after the application of the thermosetting resin because preliminary securing is completed. This improves operability and consequently reduces the manufacturing cost of a photoelectronic device.

(7) With a structure in which the package is formed by molding insulating resin, productivity of the package can be improved to allow a reduction in the manufacturing cost of a photoelectronic device.

What is claimed is:

1. A photoelectronic device comprising:
   a support substrate constituted by a mounting portion for mounting a photoelectric conversion element on one surface thereof, said support substrate having a groove for guiding an optical fiber extending toward said mounting portion;
   said photoelectric conversion element secured on said mounting portion; and
   said optical fiber fitted in said groove at one end thereof and secured on said support substrate at a region excluding the utmost end thereof, wherein the optical fiber fitted in said groove is secured with a first bonding element injected to fill the groove under the optical fiber for securing said optical fiber on said support substrate, a package encapsulating said support substrate, said photoelectric conversion element and one end of said optical fiber, and a protective element transparent to light transmitted by said optical fiber covering a region including said photoelectric conversion element on one surface of said support substrate and one end of the optical fiber in said package.

2. A photoelectronic device according to claim 1, wherein said support substrate is a silicon substrate, and said photoelectric conversion element is a semiconductor laser chip.

3. A photoelectronic device according to claim 1, wherein said package comprises a case and a cap which are made of plastic, respectively:

said support substrate is secured with an adhesive in said case having a guide for guiding said optical fiber;

said case is filled with said protective element to cover said support substrate, said photoelectric conversion element, and one end of the optical fiber; and said case is closed with said cap.

4. A photoelectronic device according to claim 1, wherein said package is constituted by an insulating resin, and said protective element is provided in said package to block the path of moisture that enters said photoelectric conversion element from the outside of the package.

5. A photoelectronic device according to claim 1, wherein said first bonding element is constituted by an ultraviolet-setting adhesive or thermosetting resin.

6. A photoelectronic device according to claim 1, wherein said protective element is constituted by any of silicone gel, silicone rubber, low-stress epoxy resin, acrylic resin or urethane resin.

7. A photoelectronic device comprising:

a support substrate constituted by a mounting portion for mounting a photoelectric conversion element on one surface thereof, said support substrate having a groove for guiding an optical fiber extending toward said mounting portion;

said photoelectric conversion element secured on said mounting portion; and said optical fiber fitted in said groove at one end thereof and secured on said support substrate at a region excluding the utmost end thereof, wherein the optical fiber fitted in said groove is secured with a first bonding element injected to fill the groove under the optical fiber for securing said optical fiber on said support substrate, a package encapsulating said support substrate, said photoelectric conversion element and one end of said optical fiber, and a protective element transparent to light transmitted by said optical fiber covering a region including said photoelectric conversion element on one surface of said support substrate and one end of the optical fiber in said package, wherein a bubble generation preventing portion is provided in the form of a recess or groove extending across said groove in a region between one end of said optical fiber secured with said first bonding element and said photoelectric conversion element.

8. A photoelectronic device according to claim 7, wherein the utmost end of one end of said optical fiber is located above said bubble preventing portion.

9. A photoelectronic device according to claim 8, wherein the utmost end face of one end of said optical fiber is aligned with or as close as several hundred μm or less to an edge of said bubble generation preventing portion.

10. A photoelectronic device according to claim 7, wherein one end of said optical fiber extends beyond said bubble generation preventing portion and its utmost end is supported by said groove.

11. A photoelectronic device according to claim 7, wherein the length of said bubble generation preventing portion is one hundred and several tens μm or more in the direction of said groove.

12. A photoelectronic device comprising:

a support substrate constituted by a mounting portion for mounting a photoelectric conversion element on one surface thereof, said support substrate having a groove for guiding an optical fiber extending toward said mounting portion;

said photoelectric conversion element secured on said mounting portion; and said optical fiber fitted in said groove at one end thereof and secured on said support substrate at a region excluding the utmost end thereof, wherein the optical fiber fitted in said groove is secured with a first bonding element injected to fill the groove under the optical fiber for preliminary securing said optical fiber on said support substrate and a second bonding element for finally securing the optical fiber on the support substrate while covering a part of said optical fiber and said support substrate, a package encapsulating said support substrate, said photoelectric conversion element and one end of said optical fiber, and a protective element transparent to light transmitted by said optical fiber covering a region including said photoelectric conversion element on one surface of said support substrate and one end of the optical fiber in said package.

13. A photoelectronic device according to claim 12, wherein said second bonding element covers all or a part of the region where said first bonding element is present.

14. A photoelectronic device according to claim 13, wherein said first bonding element is constituted by an ultraviolet-setting adhesive, and said second bonding element is constituted by thermosetting resin.

15. A photoelectronic device comprising: a support substrate constituted by a mounting portion for mounting a photoelectric conversion element on one surface thereof, said support substrate having a groove for guiding an optical fiber extending toward said mounting portion, said photoelectric conversion element secured on said mounting portion; and said optical fiber fitted in said groove at one end thereof and secured on said support substrate at a region excluding the utmost end thereof, wherein said support substrate, said photoelectric conversion element and one end of said optical fiber are covered by a package made of insulating resin; in said package, the optical fiber fitted in said groove is secured with a first bonding element injected to fill the groove under the optical fiber for securing said optical fiber on said support substrate; and a protective element transparent to light transmitted by said optical fiber and resistant to humidity covering a region including said photoelectric conversion element on one surface of said support substrate and one end of the optical fiber in said package.

16. A photoelectronic device comprising:

a support substrate constituted by a mounting portion for mounting a photoelectric conversion element on one surface thereof said support substrate having a groove for guiding an optical fiber extending toward said mounting portion;

said photoelectric conversion element secured on said mounting portion; and said optical fiber fitted in said groove at one end thereof and secured on said support substrate at a region excluding the utmost end thereof, wherein said support substrate, said photoelectric conversion element and one end of said optical fiber are covered by a package made of insulating resin; in said package, the optical fiber fitted in said groove is secured with a first bonding element injected to fill the groove under the optical fiber for securing said optical fiber on said support substrate; a protective element transparent to light transmitted by said optical fiber and resistant to humidity covers a region including said photoelectric conversion element on one surface of said support substrate and one end of the optical fiber in said package; and bubbles having diameters equal to or greater than one half of the distance between the two points of said groove in contact with the circumferential surface of said optical fiber are not present in the region defined by said optical fiber and said groove and filled with said first bonding element.

17. A photoelectric device comprising:

a support substrate having a main surface which includes a mounting portion and a groove portion;

a photoelectric conversion element secured on said mounting portion of the support substrate;

an optical fiber optically coupled to said photoelectric conversion element, said optical fiber having an utmost end portion facing said photoelectric conversion element, one end portion extending from said utmost end portion and another portion extending from said one end portion;

a package comprising a case member and a cap member which are provided with a main hollow space for housing said support substrate, said photoelectric conversion element, said utmost end portion and said one end portion of the optical fiber therein, and which are provided with a guide hollow space for housing said another portion of said optical fiber extending from said one end portion thereof to the outside of said package;

said support substrate secured on said case member in said main hollow space for said main surface thereof to face said main hollow space;

said one end portion of the optical fiber fitted in said groove of the support substrate and secured with a first adhesive material at said groove, said first adhesive material being provided in said groove so as to fill a portion of said groove under said optical fiber for securing the optical fiber with said first adhesive material, said another portion of the optical fiber fitted in said guide hollow space and secured with a second adhesive material to said package; and a protective coating material, transparent to light transmitted by said optical fiber, provided in said main hollow space, said protective coating material being formed over said photoelectric conversion element and over said portion of the groove under which said optical fiber is secured with said first adhesive material.

18. A photoelectric device according to claim 17, wherein a third adhesive material covers said one end portion of the optical fiber which is secured in said groove with said first adhesive material.

19. A photoelectric device according to claim 17, wherein said protective coating material is silicone gel.

20. A photoelectric device according to claim 17, wherein said package is made of plastic.

21. A method for manufacturing a photoelectronic device, comprising the steps of:

providing a support substrate having a photoelectric conversion element mounted on one surface thereof a groove for guiding an optical fiber extending toward said photoelectric conversion element, and a bubble generation preventing portion in the form of a recess or a groove across said groove provided closer to one end of the optical fiber than a region of said optical fiber to be secured with a bonding element;

applying an ultraviolet-setting adhesive to a part of the groove on said support substrate, fitting one end of the optical fiber in the groove on the support substrate and adjusting optical coupling between said photoelectric conversion element and optical fiber with the groove under the optical fiber filled with said ultraviolet-setting adhesive; and securing said optical fiber to said part of the groove on said support substrate excluding said bubble generation preventing protion by irradiating said ultraviolet-setting adhesive with ultraviolet light to set said ultraviolet-setting adhesive:

covering a region including said photoelectric conversion element and one end of said optical fiber, with a protective element transparent to light transmitted by said optical fiber.

22. A method for manufacturing a photoelectronic device, comprising the steps of:

providing a support substrate having a photoelectric conversion element mounted on one surface thereof and having a groove for guiding an optical fiber extending toward said photoelectric conversion element;

applying an ultraviolet-setting adhesive to a part of the groove on said support substrate, fitting one end of the optical fiber in the groove on the support substrate and adjusting optical coupling between said photoelectric conversion element and optical fiber with the groove under the optical fiber filled with said ultraviolet-setting adhesive;

securing said optical fiber on said support substrate by irradiating said ultraviolet-setting adhesive with ultraviolet light to set said ultraviolet-setting adhesive;

covering a region including said photoelectric conversion element and one end of said optical fiber, with a protective element transparent to light transmitted by said optical fiber, wherein bubbles having diameters equal to or greater than one half of the distance between the two points of said groove in contact with the circumferential surface of said optical fiber are not present in the region defined by said optical fiber and said groove and filled with said ultraviolet-setting adhesive.

23. A method for manufacturing a photoelectronic device comprising the steps of:

providing a supports substrate having a photoelectric conversion element mounted on one surface thereof and having a groove for guiding an optical fiber extending toward said photoelectric conversion element;

applying an ultraviolet-setting adhesive to a part of the groove on said support substrate, fitting one end of the optical fiber in the groove on the support substrate and adjusting optical coupling between said photoelectric conversion element and optical fiber with the groove under the optical fiber filled with said ultraviolet-setting adhesive;

securing said optical fiber on said support substrate by irradiating said ultraviolet-setting adhesive with ultraviolet light to set said ultraviolet-setting adhesive; and covering a region including said photoelectric conversion element and one end of said optical fiber, with a protective element transparent to light transmitted by said optical fiber.

24. A method for manufacturing a photoelectronic device according to claim 23, comprising the step of covering a part of said optical fiber and said support substrate with thermosetting resin and setting the thermosetting resin to secure the optical fiber on the support substrate, before said step of covering a region including said photoelectric conversion element and one end of said optical fiber, with a protective element transparent to light transmitted by said optical fiber.

25. A method for manufacturing a photoelectronic device according to claim 24, wherein securing is carried out by determining positions for preliminary securing and/or final securing such that all or a part of the portion secured with said ultraviolet-setting adhesive is covered by the portion secured with said thermosetting resin.

26. A method for manufacturing a photoelectronic device according to claim 24, wherein securing is carried out such that a part of the portion secured with said ultraviolet-setting adhesive is covered by the portion secured with said thermosetting resin and such that the portion secured with the thermosetting resin is located on the side of the portion secured with said ultraviolet-setting adhesive farther from said photoelectric conversion element.

27. A method for manufacturing a photoelectronic device according to claim 24, wherein the process of setting said thermosetting resin is performed on a batch process basis.

28. A method for manufacturing a photoelectronic device comprising:

a package constituted by a case made of plastic having a guide for guiding an optical fiber and a cap made of plastic for closing said case, attached to the case with an adhesive;

a support substrate secured in said case having a photoelectric conversion element mounted on one surface thereof and having a groove for guiding said optical fiber extending toward said photoelectric conversion element, said optical fiber being guided by said guide into and out of the package, wherein one end of the optical fiber extending in said package is fitted in the groove on said support substrate and is secured on the support substrate through securing with an ultraviolet-setting adhesive and securing with thermosetting resin, the method comprising the steps of:

applying the ultraviolet-setting adhesive to a part of the groove on said support substrate, fitting one end of the optical fiber in the groove on the support substrate and adjusting optical coupling between said photoelectric conversion element and optical fiber with the groove under the optical fiber filled with said ultraviolet-setting adhesive;

securing said optical fiber on said support substrate by irradiating said ultraviolet-setting adhesive with ultraviolet light to set said ultraviolet-setting adhesive; and filling said case with a protective element transparent to light transmitted by said optical fiber before mounting the cap and setting the same.

29. A method for manufacturing a photoelectronic device according to claim 28, wherein said protective element is formed using any of silicone gel, silicone rubber, low-stress epoxy resin, acrylic resin or urethane resin.

30. A method of manufacturing a photoelectronic device comprising:

a package made of insulating resin;

a support portion located in said package;

a support substrate secured to said support portion having a photoelectric conversion element mounted on one surface thereof and having a groove for guiding an optical fiber extending toward said photoelectric conversion element;

said photoelectric conversion element secured on said mounting portion; and said optical fiber fitted in the groove on said support substrate and guided by a guide or a ferrule having a sleeve with one end thereof in a face-to-face relationship with said photoelectric conversion element and the other end thereof located outside said package and protected by a jacket, wherein one end of the optical fiber extending in said package is fitted in the groove on said support substrate and is secured on the support substrate through securing with an ultraviolet-setting adhesive and securing with thermosetting resin, the method comprising the steps of:

providing said support substrate on which a lead frame having said support portion thereon and said photoelectric conversion element are secured;

securing said support substrate to the support portion on said lead frame;

applying the ultraviolet-setting adhesive to a part of the groove on said support substrate, fitting one end of the optical fiber protected by a jacket and guided by a guide or a ferrule having a sleeve, in the groove on the support substrate, and adjusting optical coupling between said photoelectric conversion element and optical fiber with the groove under the optical fiber filled with said ultraviolet-setting adhesive;

securing said optical fiber on said support substrate by irradiating said ultraviolet-setting adhesive with ultraviolet light to set the ultraviolet-setting adhesive;

connecting a wiring on said support substrate and leads on said lead frame with conductive wires before or after securing said optical fiber on said support substrate;

covering a region including said photoelectric conversion element, one end of said optical fiber, said wires and the region of the leads connected to said wires, with a protective element transparent to light transmitted by said optical fiber;

molding a region including said jacket or said sleeve halfway with insulating resin to form said package; and cutting and removing an unnecessary part of the lead frame protruding from said package.

31. A method for manufacturing a photoelectronic device comprising an optical fiber, a support substrate having a photoelectric conversion element mounted on one surface thereof and having a groove for guiding said optical fiber extending toward said photoelectric conversion element, and a protective film transparent to light transmitted by said optical fiber and resistant to humidity, provided in a package made of insulating resin, the method comprising the steps of:

applying a first adhesive to a part of the groove on said support substrate;

fitting one end of the optical fiber in the groove on said support substrate and adjusting optical coupling between said photoelectric conversion element and optical fiber with the groove under the optical fiber filled with said first adhesive;

securing said optical fiber on said support substrate with said first adhesive; and forming a protective film transparent to light transmitted by said optical fiber and resistant to humidity in said package so as to cover a part of said optical fiber secured on said support substrate with said first adhesive, one end of said optical fiber opposing to said photoelectric conversion element, said photoelectric conversion element, and a region in said package between said photoelectric conversion element and one end of said optical fiber opposed to each other.

32. A method for manufacturing a photoelectronic device according to claim 31, wherein said first adhesive is an ultraviolet-setting adhesive which is irradiated with ultraviolet light to be set.

* * * * *